United States Patent [19]
Miho et al.

[11] Patent Number: 5,252,976
[45] Date of Patent: Oct. 12, 1993

[54] SEQUENTIAL COMPARISON TYPE ANALOG-TO-DIGITAL CONVERTER

[75] Inventors: Akira Miho, Yokohama; Tatsuya Akiyama; Hideki Isobe, both of Kawasaki, all of Japan

[73] Assignee: Fujitsu Limited, Kanagawa, Japan

[21] Appl. No.: 735,605

[22] Filed: Jul. 25, 1991

[30] Foreign Application Priority Data

Jul. 26, 1990 [JP] Japan .................................. 2-200648

[51] Int. Cl.⁵ .............................................. H03M 1/40
[52] U.S. Cl. ..................................... 341/163; 341/122
[58] Field of Search ............... 341/122, 161, 163, 164, 341/165

[56] References Cited

U.S. PATENT DOCUMENTS

| | | | |
|---|---|---|---|
| 4,897,658 | 1/1990 | Fujii et al. ............................ | 341/161 |
| 4,973,975 | 11/1990 | Yamazaki et al. ................... | 341/122 |
| 4,989,004 | 1/1991 | Kanayama .......................... | 341/161 |

FOREIGN PATENT DOCUMENTS 160219 10/1982 Japan .

*Primary Examiner*—Marc S. Hoff
*Attorney, Agent, or Firm*—Armstrong, Westerman, Hattori, McLeland & Naughton

[57] ABSTRACT

An analog-to-digital converter includes a sample and hold circuit for sampling and holding an analog input signal, a comparator circuit for comparing the analog input signal held by the sample and hold circuit with an input signal and generating an output signal, a control circuit for generating a digital signal based on the output signal of the comparator circuit, a digital-to-analog converter for converting the digital signal generated from the control circuit into an analog signal and for supplying the analog signal to the comparator circuit as the input signal, and an initial setting circuit for initializing the analog input signal held by the sample and hold circuit and the input signal which is output from the digital-to-analog converter to a reference voltage.

33 Claims, 24 Drawing Sheets

SEQUENTIAL COMPARISON TYPE ANALOG-TO-DIGITAL CONVERTER

BACKGROUND OF THE INVENTION

The present invention generally relates to analog-to-digital (A/D) converters, and more particularly to an A/D converter of the so-called sequential comparison type, for example, in which an input voltage is held using a sample and hold circuit and the input voltage is thereafter compared with a predetermined voltage.

FIG.1 shows an example of a conventional sequential comparison type A/D converter. A multiplexer 1 receives analog input signal (voltage) Al through An from a plurality of input channels, and selects one analog input signal in response to a channel selection signal CHS. A sample and hold (S/H) circuit 2 samples and holds the voltage of the output analog signal of the multiplexer 1 at a certain time. A comparator circuit 3 compares a voltage AN1 which is held in the S/H circuit 2 with an analog output voltage AN2 of a digital-to-analog (D/A) converter circuit 9. A control circuit 4 generates digital signals B1 through Bm corresponding to the voltage ANI which is held in the S/H circuit 2 based on a comparison result received from the comparator circuit 3. A sequential comparison register 5 temporarily stores the digital signals B1 through Bm output from the control circuit 4. An output storage register 6 stores the final result (digital signals Bl through Bm) of the contents of the sequential comparison register 5. The D/A converter circuit 9 generates the analog output voltage AN2 corresponding to the digital signals B1 through Bm stored in the sequential comparison register 5.

FIG.2 shows a conceivable construction of the A/D converter shown in FIG. 1. In FIG. 2, the same designations are used as in FIG.1. For the sake of convenience, it is assumed that the A/D converter shown in FIG.2 has three input channels ch1 through ch3, and that a 6-bit digital signal made up of bits B1 through B6 is output in response to an analog input signal.

The D/A converter circuit 9 includes a capacitor part 12 and a digital input part 14. The capacitor part 12 includes seven capacitors C1 through C6 and C6, and the capacitances of the capacitors C1, C2, C3, C4 and C5 respectively are $2^5$, $2^4$, $2^3$, $2^2$ and $2^1$ times the capacitance of the capacitor C6. The digital input part 14 makes charge and discharge operations with respect to electrodes X1 through X6 of the capacitors C1 through C6 based on digital control signals. The S/H circuit 2 includes a switch 15 and the capacitor part 12. In other words, the capacitor part 12 is used in common as a part of the D/A converter circuit 9 and a part of the S/H circuit 2. The comparator circuit 3 includes a comparator part 13 which is made up of comparators COM1 through COM3. The comparator COM1 includes an inverter IV1 and a transistor N7, the comparator COM2 includes an inverter IV2 and a transistor N8, and the comparator COM3 includes an inverter IV3 and a transistor N9 which are connected as shown. The comparators COM1 through COM3 are connected in series to obtain a relatively high amplification.

Next, a description will be given of an operation of the A/D converter shown in FIG.2 by referring to FIG.3.

First, a description will be given of the sampling and holding of the analog input signal which is to be compared.

(1) During a sampling time M1 in which a sampling pulse $\phi_{SMP}$ has a high level as shown in FIG.3(B), switches SW1 through SW3 of the multiplexer 1 are controlled based on the channel selection signal CHS. For example, the channel ch2 is selected from the input channels ch1 through ch3 in response to the channel selection signal CHS. The analog input signal of the input channel ch2 is 5V during the sampling time M1 as shown in FIG.3(A), and the voltage of 5V is applied in common to switches S1 through S6 of the switch 15 which correspond to the 6 bits. Since the switches S1 through S6 are closed during this sampling time M1 in response to a switching signal SWS, a charge corresponding to the voltage of the analog input signal is stored at the electrodes X1 through X6 of the capacitors C1 through C6 within the capacitor part 12. FIG.3(C) shows the voltage at the electrodes X1 through X6.

(2) The switches S1 through S6 are thereafter opened at an arbitrary time in response to the switching signal SWS, and this arbitrary time is the end of the sampling time M1 in this case. Hence, the charge corresponding to the voltage of the analog input signal is held at the electrodes X1 through X6 of the capacitors C1 through C6. In this state, high-level digital control signals D1a through D6a and low-level digital control signals D1b through D6b from the sequential comparison register 5 are supplied to the digital input part 14, but transistors P1 through P6 and N1 through N6 of the digital input part 14 are all OFF. Hence, the electrodes X1 through X6 are electrically isolated from the digital input part 14.

On the other hand, during the sampling time M1, a charge equal to the charge at the electrodes X1 through X6 but of the opposite polarity is stored at electrodes Y1 through Y6 because the transistors N7 through N9 of the comparator part 13 are ON. Since input and output ends of the inverter IV1 are short-circuited in this state, the voltage at the electrodes Y1 through Y6 is approximately the logic threshold voltage of the inverter IV1 which is 2.5 V, for example. At an arbitrary time, the negative charge of a quantity equal to the positive charge stored at the electrodes X1 through X6 is sampled and held at the electrodes Y1 through Y6.

Next, a description will be given of a first comparison of the analog input signal and the digital value received from the sequential comparison register 5.

(3) During a sequential comparison time ml in which the sampling pulse $\phi_{SMP}$ has a low level as shown in FIG.3(B), the transistors N7 through N9 of the comparator part 13 are OFF and the comparator part 13 is in a comparing mode.

The control circuit 4 sets "1" to only the most significant bit (MSB) B1 and sets the digital signals B1 through B6 ("100000") into the sequential comparison register 5. For example, the MSB B1 has a voltage which is ½ the sum of maximum and minimum voltages of the analog signal which is output from the D/A converter circuit 9. The sequential comparison register 5 transmits the digital signals B1 through B6 to the digital input part 14 by supplying high-level digital control signals D1a and D1b and low-level digital control signals D2a through D6a and D2b through D6b.

The transistors P1 through P6 and N1 through N6 of the digital input part 14 are controlled by the digital control signals D1a through D6a and D1b through D6b so that a positive charge is stored at only the electrode X1 of the capacitor C1 and the charge in the capacitors C2 through C6 are discharged by grounding the electrodes X2 through X6. Accordingly, a negative charge of a quantity equal to the positive charge stored at the electrode X1 is stored at the other electrode Y1 of the capacitor C1. However, the total charge stored at the electrodes Y1 through Y6 during the sampling (2) described above is greater than the total charge stored at the electrodes X1 through X6, and the voltage at the electrode Y6 decreases. The gate voltage at the inverter IV1 of the comparator part 13 becomes smaller than the threshold voltage during the sampling time M1, and a transistor P10 of the inverter IV1 turns ON to supply a comparison result REFS which is "1" to the control circuit 4. The transistor P10 forms the inverter IV1 together with a transistor N10.

Next, a description will be given of a second comparison of the analog input signal and the digital value received from the sequential comparison register 5.

(4) When the comparison result REFS is "1" as a result of the comparison (3) described above, the control circuit 4 sets the second MSB B2 to "1", and supplies the digital signals B1 through B6 ("110000" to the sequential comparison register 5. For example, the second MSB B2 has a voltage which is $\frac{3}{4}$ the sum of maximum and minimum voltages of the analog signal which is output from the D/A converter circuit 9.

On the other hand, when the comparison result REFS is "0" as a result of the comparison (3) described above, the control circuit 4 sets the MSB B1 to "0" and the second MSB B2 to "1", and supplies the digital signals B1 through B6 ("010000") to the sequential comparison register 5. For example, the second MSB B2 has a voltage which is $\frac{1}{4}$ the sum of maximum and minimum voltages of the analog signal which is output from the D/A converter circuit 9.

The digital input part 14 supplies charges corresponding to the digital signals B1 through B6 to the respective electrodes X1 through X6 of the capacitors C1 through C6. Accordingly, a negative charge of a quantity equal to the total charge stored at the electrodes X1 and X2 is stored at the electrode Y1, and the total charge stored at the electrodes Y1 through Y6 raises or lowers the voltage at the electrodes Y1 through Y6 depending on the relationship with the total charge stored at the electrodes X1 through X6. The comparator part 13 supplies the comparison result REFS to the control circuit 4 based on the relationship of the voltage at the electrodes Y1 through Y6 and the threshold voltage of the inverter IV1.

Next, a description will be given of third through sixth comparisons of the analog input signal and the digital value received from the sequential comparison register 5.

(5) The comparison is repeated for 3, 4, 5 and 6 bits based on the comparison result REFS from the comparator part 3, similarly as in the case of the operations (3) and (4) described above. When six comparisons to a least significant bit (LSB) B6 ends, the control circuit 4 stores the digital signals B1 through B6 at the time when the comparison ends into the output storage register 6 via the sequential comparison register 5. For example, the digital signals B1 through B6 which are stored in the output storage register 6 are used as data of a microcomputer (not shown).

(6) At the next A/D conversion cycle, the operations (1) through (5) described above are repeated so as to carry out a continuous A/D conversion.

For example, the sequential comparison type A/D converter described above is provided on a single chip together with a microprocessor, and is used for converting analog signals from various sensors such as temperature and flow rate sensors into digital signals when carrying out a process such as temperature control and flow rate control. In the case shown in FIG.2, a sensor 10 detects a change in external temperature or flow rate and outputs an analog signal which describes the detection result. This analog signal from the sensor 10 is supplied to the multiplexer 1 of the A/D converter.

However, the analog signal from the sensor 10 includes a small noise component in addition to the effective signal component. For this reason, a filter is provided inside the sensor 10 or connected externally to the sensor 10 so as to eliminate the noise component. In the case shown in FIG.2, the filter is made up of a capacitor $C_S$ and a resistor $R_S$ which are connected in parallel, and this filter is connected to an internal circuit 11 of the sensor 10.

When the noise component output from the sensor is relatively large, the capacitance of the capacitor $C_S$ and the resistance of the resistor $R_S$ are respectively set large in order to eliminate the noise component. For example, the capacitance of the capacitor $C_S$ is set to 10 $\mu$F and the resistance of the resistor $R_S$ is set to 10 k$\Omega$.

However, when the analog signal from the sensor includes the relatively large noise component, the charge which is held in the S/H circuit 2 during the Nth A/D conversion cycle of the sequential comparison type A/D converter may not change quickly enough to the charge which corresponds to the analog input signal which is to be held during the (N+1)th A/D conversion cycle because of the large difference in the voltages held in the S/H circuit 2 during the Nth and (N+1)th A/D conversion cycles.

The above described problem will now be described in more detailed by referring to FIG.3. For the sake of convenience, it is assumed that during the Nth A/D conversion cycle which includes the sampling time M1 and the sequential comparison time m1, the analog input signal is 5 V which is the maximum value of the input analog signal of the sequential comparison type A/D converter as shown in FIG.3(A) and the charge corresponding to this 5 V is held at the capacitor part 12 during the sampling time M1 by the operation (2) described above. In this case, the same charge is stored at the electrodes Y1 through Y6 of the capacitors C1 through C6. The held charge is used to generate the digital signal corresponding to the 5 V analog input signal during the sequential comparison time m1 by the operations (3) through (5) described above. When the operation (5) ends during the sequential comparison time m1, that is, at the end of the sixth comparison described above, a charge approximately equal to the 5 V held in the capacitor part 12 is held at the electrodes X1 through X6 of the capacitors C1 through C6 by the sequential comparison.

As shown in FIG.3(A), during the next (N+1)th A/D conversion cycle which includes a sampling time M2 and a sequential comparison time m2, it is assumed for the sake of convenience that the analog input signal is 0 V which is the minimum value of the input analog signal of the sequential comparison type A/D converter. In this case, during the sampling time M2, the digital input part 14 is electrically isolated from the capacitors C1 through C6, and the charge at the electrodes X1 through X6 is discharged towards the sensor 10 when the switches S1 through S6 close. However, since the capacitance and the resistance of the respective capacitor $C_S$ and the resistor $R_S$ are large, this discharge is suppressed.

For this reason, when the sampling time M2 shown in FIG.3(C) is short, the sampling time M2 ends before the voltage at the electrodes X1 through X6 fall to 0 V. In this case, a voltage which is $\phi$ V greater than 0 V is erroneously held at the electrodes X1 through X6. A similar situation occurs when the analog input signal is 0 V during the Nth A/D conversion cycle and the analog input signal is 5 V during the next (N+1)th A/D conversion cycle. In this latter case, the sampling time M2 ends before the voltage at the electrodes X1 through X6 rise to 5 V.

On the other hand, if the sampling times M1, M2, . . ., Mn were respectively made sufficiently long, the $\phi$ V is gradually discharged via the capacitor $C_S$ and the resistor $R_S$, and thus, the voltage at the electrodes X1 through X6 fall to approximately 0 V. But this would inevitably require long A/D conversion cycles, thereby making a high-speed A/D conversion difficult.

SUMMARY OF THE INVENTION

Accordingly, it is a general object of the present invention to provide a novel and useful A/D converter in which the problems described above are eliminated.

Another and more specific object of the present invention is to provide an analog-to-digital converter comprising sample and hold means for sampling and holding an analog input signal, comparator means for comparing the analog input signal held by the sample and hold means and an input signal and for generating an output signal, control means for generating a digital signal based on the output signal of the comparator means, digital-to-analog converter means for converting the digital signal generated from the control means into an analog signal and for supplying the analog signal to the comparator means as the input signal, and initial setting means for initializing the analog input signal held by the sample and hold means and the input signal which is output from the digital-to-analog converter means to a reference voltage. According to the analog-to-digital converter of the present invention, it is possible to carry out the analog-to-digital conversion at a high speed with a high reliability.

Still another object of the present invention is to provide an analog-to-digital converter comprising input means for receiving an analog input signal, sample and hold means, coupled to the input means, including sampling means for sampling the analog input signal from the input means at predetermined timings and holding means coupled to the sampling means for holding each sampled signal voltage, the sampling means and the holding means carrying out the sampling and holding during a sampling time, comparator means, coupled to the sample and hold means, for comparing the signal voltage held by the sample and hold means with an analog control voltage and for outputting an output signal indicating an error between the two compared voltages during a sequential comparison time which follows the sampling time, control means, coupled to the comparator means, for sequentially varying the analog control voltage based on the output signal of the comparator means until the error becomes approximately zero, and initial setting means, inserted between the input means and the sample and hold means, for forcibly setting a reference voltage to be held by the sample and hold means during an initializing time, the holding means being electrically coupled to the input means via the initial setting means and electrically disconnected from the comparator means during the sampling time, the holding means being electrically disconnected from the input means and electrically coupled to the comparator means during the sequential comparison time, the holding means being electrically disconnected from the comparator means during the initializing time. According to the analog-to-digital converter of the present invention, it is possible to carry out the analog-to-digital conversion at a high speed even when the analog input signal is received via a circuit having a high impedance.

A further object of the present invention is to provide an analog-to-digital converter comprising input means for receiving an analog input signal, sample and hold means, coupled to the input means, including sampling means for sampling the analog input signal from the input means at predetermined timings and holding means coupled to the sampling means for holding each sampled signal voltage, the sampling means and the holding means carrying out the sampling and holding during a sampling time, comparator means, coupled to the sample and hold means, for comparing the signal voltage held by the sample and hold means with an analog control voltage and for outputting an output signal indicating an error between the two compared voltages during a sequential comparison time which follows the sampling time, control means, coupled to the comparator means, for sequentially varying the analog control voltage based on the output signal of the comparator means until the error becomes approximately zero, and initial setting means, coupled to the sample and hold means, for forcibly setting a reference voltage to be held by the sample and hold means during an initializing time, the holding means being electrically coupled to the input means via the sampling means and electrically disconnected from the comparator means during the sampling time, the holding means being electrically disconnected from the input means and electrically coupled to the comparator means during the sequential comparison time, the holding means being electrically disconnected from the input means and the comparator means during the initializing time. According to the analog-to-digital converter of the present invention, it is possible to carry out the analog-to-digital conversion at a high speed with a high reliability.

Other objects and further features of the present invention will be apparent from the following detailed description when read in conjunction with the accompanying drawings.

DESCRIPTION OF THE PREFERRED EMBODIMENTS

Figure 4:
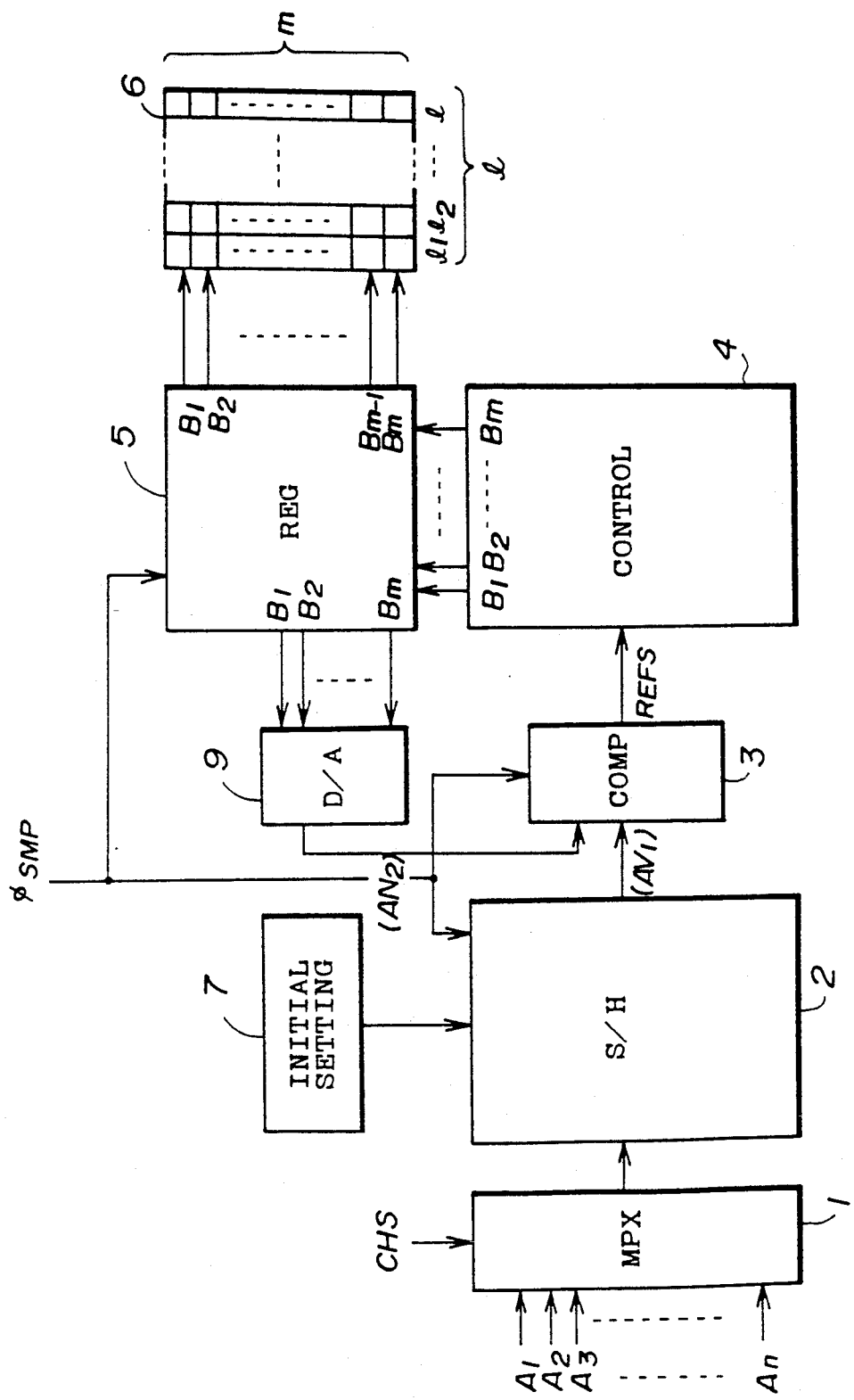
FIG.4 is a system block diagram for explaining an operating principle of an A/D converter according to the present invention.

First, a description will be given of an operating principle of a sequential comparison type A/D converter according to the present invention, by referring to FIG.4. In FIG.4, those parts which are the same as those corresponding parts in FIG.1 are designated by the same reference numerals, and a description thereof will be omitted.

Figure 1:
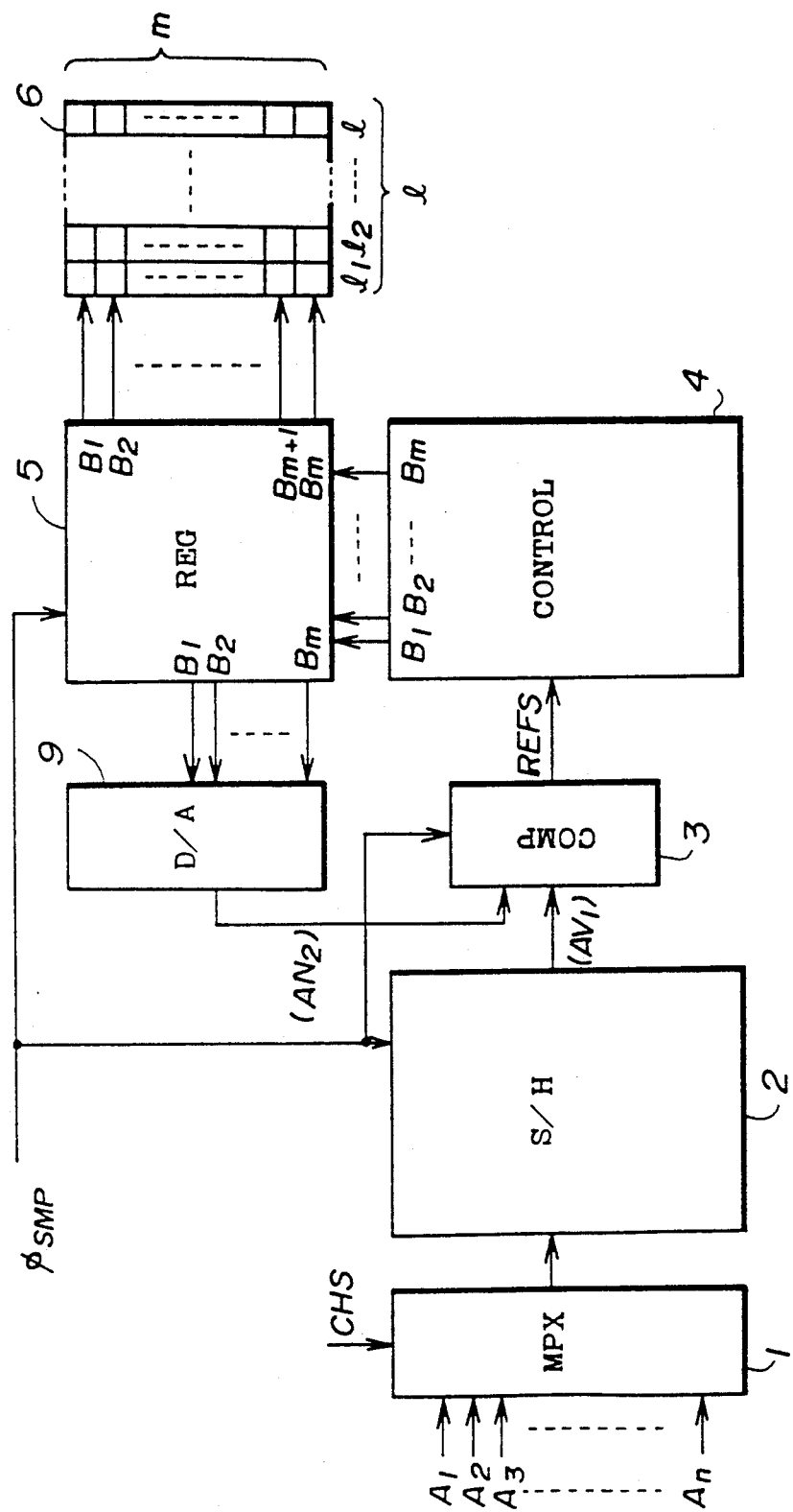
FIG.1 is a system block diagram showing an example of a conventional sequential comparison type A/D converter.

In addition to the elements shown in FIG.1, the present invention includes an initial setting circuit 7 which is coupled to the S/H circuit 2 as shown in FIG.4. The initial setting circuit 7 forcibly charges or discharges the charge which is held in the S/H circuit 2 before the Nth A/D conversion cycle to a reference voltage. In this embodiment, this reference voltage is ½ the sum of maximum and minimum voltages of the analog input signal which is supplied to the A/D converter.

Figure 2:
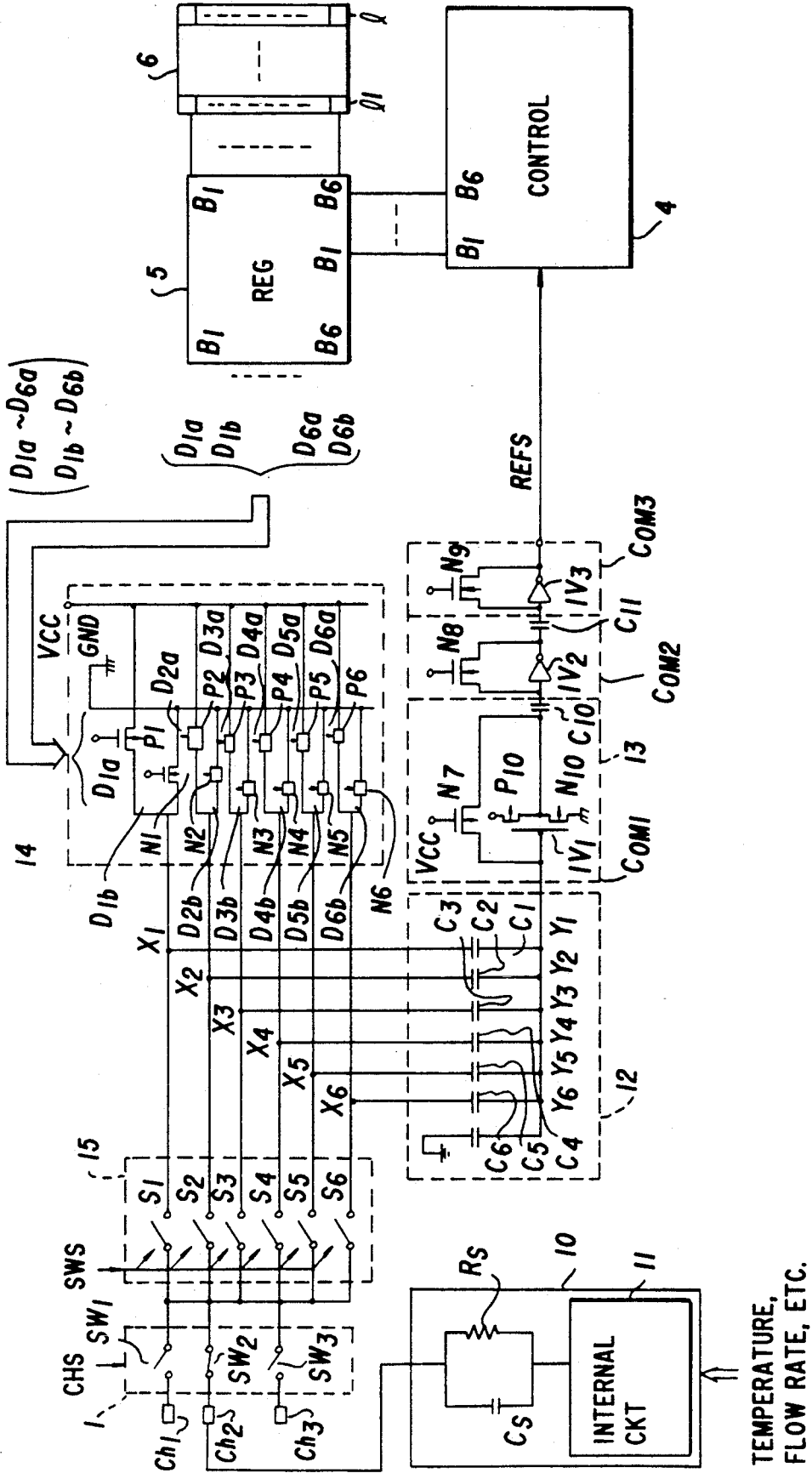
FIG.2 is a circuit diagram showing a conceivable construction of the A/D converter shown in FIG.1.
Figure 5:
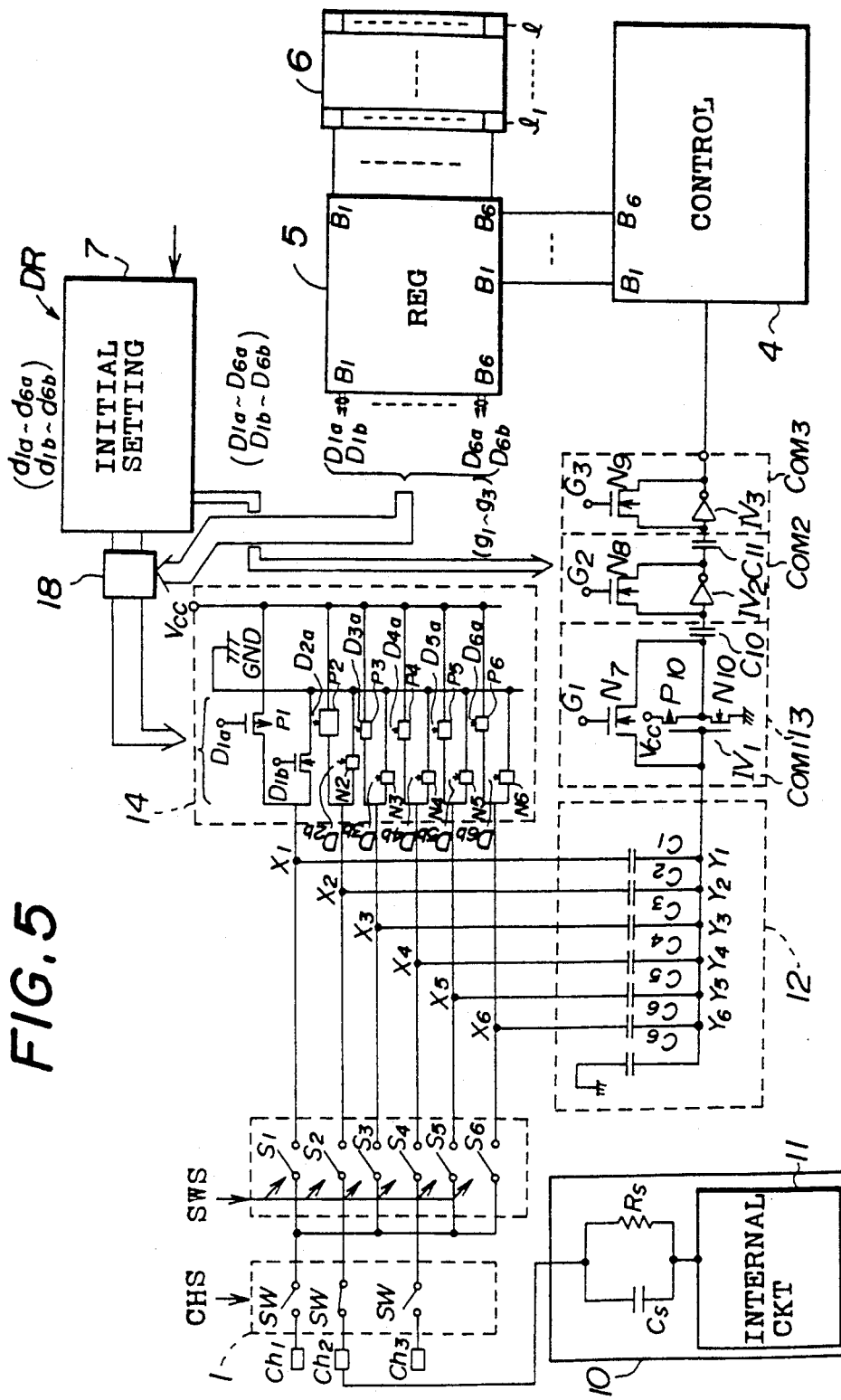
FIG.5 is a circuit diagram showing a first embodiment of the A/D converter according to the present invention.

FIG.5 shows a first embodiment of the A/D converter according to the present invention. In FIG.5, those parts which are the same as those corresponding parts in FIGS.2 and 4 are designated by the same reference numerals, and a description thereof will be omitted. In FIG.5, the initial setting circuit 7 is coupled to the digital input part 14 via a switch 18.

The initial setting circuit 7 initializes the electrodes X1 through X6 of the capacitors C1 through C6 before the sampling time of the A/D conversion cycle, that is, before the operation (1) described above with reference to FIG.2. As described above, the A/D conversion cycle is made up of the sampling time and the sequential comparison time. The initializing operation of the initial setting circuit 7 temporarily sets the electrodes X1 through X6 to the reference voltage. This reference voltage is selected between the maximum and minimum voltages of the analog input voltage which is received by the A/D converter, or selected to a predetermined voltage within a tolerable voltage range of the A/D converter.

Particularly, the initial setting circuit 7 of this embodiment generates the digital control signals D1a through D6a and D1b through D6b which are respectively supplied to the gate electrodes of the transistors P1 through P6 and N1 through N6 within the digital input part 14. As described above, the digital input part 14 determines the potentials to be stored at the electrodes X1 through X6 of the capacitors C1 through C6.

On the other hand, the initial setting circuit 7 also initializes the electrodes Y1 through Y6 so as to quickly change the charges at the electrodes X1 through X6 during the initializing operation. Particularly, the initial setting circuit 7 generates comparator part control signals g1 through g3 to turn ON the transistors N7 through N9 within the comparator part 13, and to couple the electrodes Y1 through Y6 to a power source line Vcc via the CMOS transistor P10 and to a ground line GND via the CMOS transistor N10. A mutual inductance gm of the transistors P10 and N10 is relatively small, so that the charging and discharging at the electrodes Y1 through Y6 can be made quickly.

During the A/D conversion cycle, the switch 18 supplies the output digital control signals D1a through D6a and D1b through D6b of the sequential comparison register 5 to the digital input part 14 and also couples the sequential comparison register 5 and the digital input part 14. On the other hand, during the initializing operation which is carried out between the A/D conversions, the switch 18 supplies output digital control signals d1a through d6a and d1b through d6b of the initial setting circuit 7 to the digital input part 14 and also couples the initial setting circuit 7 and the digital input part 14.

Figure 6:
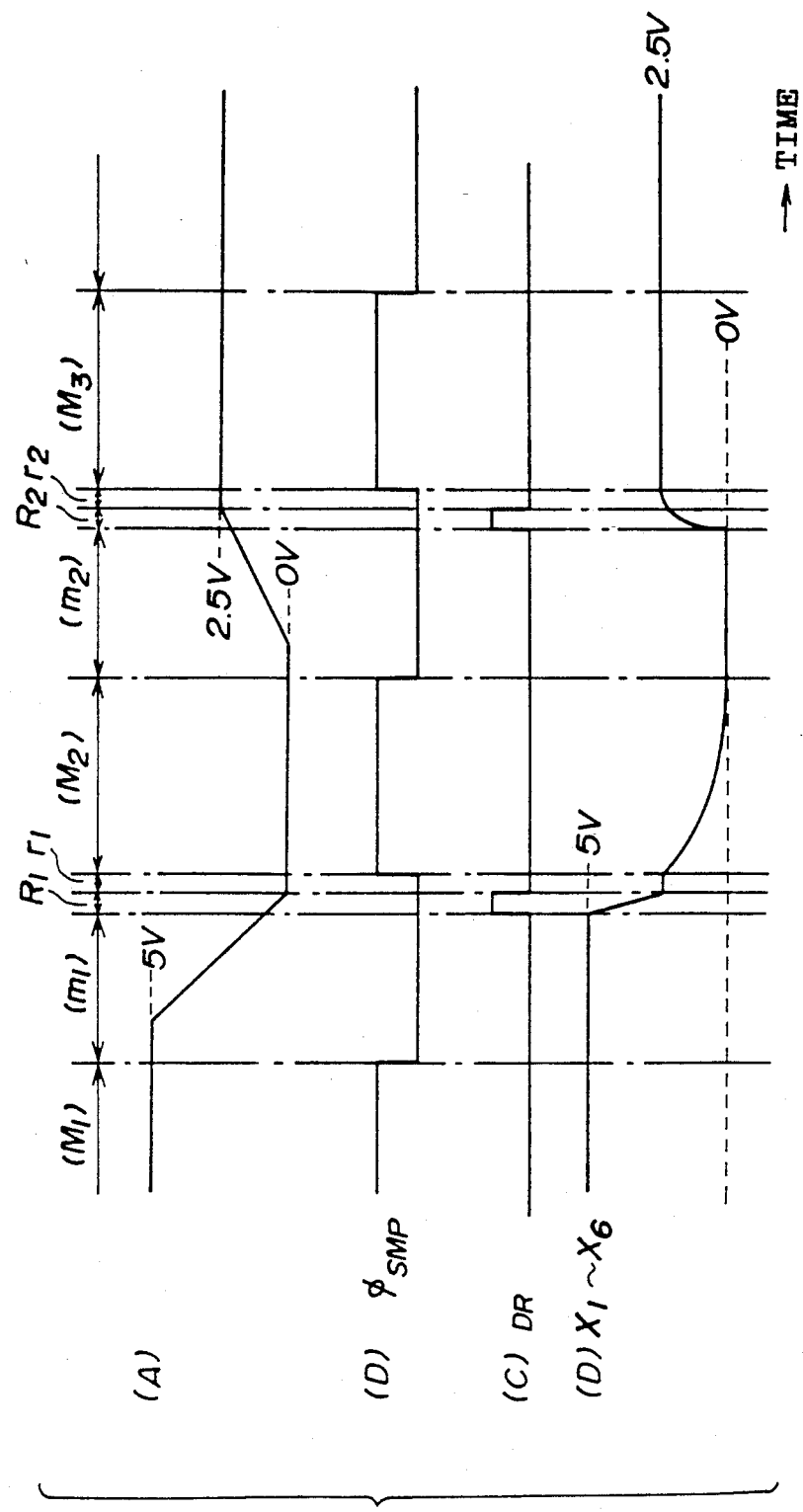
FIG.6 is a time chart for explaining the operation of the first embodiment.

Next, a description will be given of the operation of this embodiment, by referring to FIG.6. In FIG.6, the same designations are used as in FIG.3. FIG.6(A) shows the analog input voltage which is input to the A/D converter, FIG.6(B) shows the sampling pulse $\phi_{SMP}$, FIG.6(C) shows an initializing pulse DR, and FIG.6(D) shows the voltage at the electrodes X1 through X6.

It is assumed for the sake of convenience that this embodiment shown in FIG.5 has three input channels ch1 through ch3 and outputs 6 bits of digital signals B1 through B6 in response to an analog input signal as in the case of the A/D converter shown in FIG.2. In addition, the D/A converter circuit 9 is formed from the capacitor part 12 and the digital input part 14, and the capacitances of the capacitors C1 through C6 within the capacitor part 12 are set as described above. The power source voltage Vcc is 5 V, and the ground voltage GND is 0 V. Furthermore, the voltage range of the analog input voltage supplied to the A/D converter is 0 to 5 V.

First, a description will be given of the initializing operation in which the charge held in the S/H circuit 2 is initialized to the reference voltage by the initial setting circuit 7.

[1] The initializing time pulse DR is temporarily set to a high level. During a high-level period R1 of this initializing time pulse DR is the initializing time of the S/H circuit 2. The connection of the digital input part 14 to the sequential comparison register 5 is switched to the initial setting circuit 7 by the switch 18 in response to the rising edge of the initializing time pulse DR. As a result, the output digital control signals d1a through d6a and d1b through d6b of the initial setting circuit 7 are supplied to the digital input part 14.

Because the voltage range of the analog input voltage 0 to 5 V in this embodiment, it is necessary to take measures so that the voltage at the electrodes X1 through X6 changes to the reference voltage in the same manner regardless of whether the analog input voltage changes to the maximum or minimum voltage, that is, from 0 to 5 V or from 5 to 0 V. When the reference voltage is set to 2.5 V which is ½ the power source voltage Vcc, the switch 18 supplies low-level digital control signals d1a and d1b to the respective transistors P1 and N1 of the digital input part 14 and supplies high-level digital control signals d2a through d6a and d2b through d6b to the respective transistors P2 through P6 and N2 through N6 of the digital input part 14.

Accordingly, the transistor P1 turns ON, the transistor N1 turns OFF, and the 5 V power source voltage Vcc is applied to the electrode X1 to store a predetermined charge thereat. The other electrodes X2 through X6 are all grounded and discharge the charges stored thereat.

On the other hand, high-level comparator part control signals g1 through g3 are respectively applied to gate electrodes G1 through G3 of the transistors N7 through N9 within the comparator part 13. Hence, the transistors N7 through N9 turn ON. As a result, the charge held at the electrodes Y1 through Y6 is discharged or charged via the transistors N7 through N9 and the CMOS transistors P10 and N10 of the inverter IV1 so that the charge at the electrodes Y1 through Y6 becomes equal to the charge which is stored by the electrode X1 alone.

[2] At the end of the initializing operation, the connection of the digital input part 14 to the initial setting circuit 7 is switched to the sequential comparison register 5 by the switch 18. As a result, the output digital control signals D1a through D6a and D1b through D6b of the sequential comparator register 5 are supplied to the digital input part 14 so that the transistors P1 through P6 and N1 through N6 all turn OFF. However, the transistors N7 through N9 of the comparator part 13 remain ON until the next sampling time.

Hence, the electrodes X1 through X6 are in a kind of a floating state during a time r1, and the times R1 and r1 make up the initializing time.

The connection of the digital input part 14 to the initial setting circuit 7 is switched to the sequential comparison register 5 by the switch 18 as described above to set the A/D conversion.

The sampling of the analog input voltage to be compared and the holding of the analog input voltage are carried out as follows.

[3] During a sampling time M1 in which the sampling pulse $\phi_{SMP}$ shown in FIG.6(B) has a high level, the multiplexer 1 selects the input channel ch2 based on the channel selection signal CHS. The 5 V analog input voltage shown in FIG.6(A) is input to the input channel ch2 and is supplied in common to the switches S1 through S6 which correspond to the 6 bits.

[4] When the switches S1 through S6 are closed, the positive charge corresponding to the analog input voltage is stored at the electrodes X1 through X6 of the capacitors C1 through C6 within the capacitor part 12. On the other hand, the transistors N7 through N9 of the comparator part 13 are ON, and thus, the negative charge equal in quantity to the positive charge stored at the electrodes X1 through X6 is stored at the other electrodes Y1 through Y6. At this point in time, high-level digital control signals D1a through D6a and low-level digital control signals D1b through D6b are supplied to the digital input part 14, thereby turning OFF all of the transistors P1 through P6 and N1 through N6 of the digital input part 14. Hence, the digital input part 14 is electrically isolated from the electrodes X1 through X6.

[5] Thereafter, the switches S1 through S6 are opened at an arbitrary point in time during the sampling time M1. In this embodiment, this arbitrary point in time is the end of the sampling time M1. Hence, a positive charge corresponding to the analog input voltage immediately before the arbitrary point in time is held at the electrodes X1 through X6. A negative charge equal in quantity to the positive charge at the electrodes X1 through X6 is present at the other electrodes Y1 through Y6.

The analog input voltage and the digital value of the sequential comparison register 5 are sequentially compared.

[6] The first comparison of the analog input signal and the digital value received from the sequential comparison register 5 is made as follows. During a sequential comparison time m1 in which the sampling pulse $\phi_{SMP}$ has a low level as shown in FIG.6(B), the comparator part 13 is in the comparing mode in which a comparison is enabled because the transistors N7 through N9 of the comparator part 13 turn OFF as the sampling time M1 changes to the sequential comparison time m1.

[7] The control circuit 4 sets only the MSB B1 to "1" and sets the digital signals B1 through B6 ("100000") to the sequential comparison register 5. For example, the MSB B1 is set to 2.5 V which is ½ the sum of the maximum and minimum voltages of the analog signal output from the D/A converter circuit 9. Based on the digital signals B1 through B6, the sequential comparison register 5 supplies high-level digital control signals D1a and D1b and low-level digital control signals D2a through D6a and D2b through D6b to the digital input part 14. The transistors P1 through P6 and N1 through N6 of the digital input part 14 are controlled based on the digital control signals D1a through D6a and D1b through D6b. Since the digital control signals D1a and D1b respectively have a high level, the power source voltage of 5 V is applied to only the electrode X1 of the capacitor C1 from the power source line Vcc. The electrodes X2 through X6 of the capacitors C2 through C6 are grounded to discharge the charged stored therein. As a result, a charge corresponding to the analog signal voltage of 2.5 V output from the D/A converter circuit 9 is stored at the electrode X1.

[8] The electrode Y1 stores a negative of a quantity equal to that of the charge stored at the electrode X1. However, since the total charge stored at the electrodes Y1 through Y6 of the capacitors C1 through C6 at the time of the sampling is greater than the total charge stored at the electrodes Xl through X6, and the voltage at the electrode Y6 decreases. In addition, the gate voltage of the inverter IV1 within the comparator part 13 becomes lower than the threshold voltage of the inverter IV1 during the sampling time M1. Thus, the transistor P10 turns ON and a signal "1" is supplied to the control circuit 4 as the comparison result REFS.

[9] The second comparison of the analog input signal and the digital value received from the sequential comparison register 5 is made as follows. When the comparison result REFS obtained by the operation [8] described above is "0", the control circuit 4 sets the second MSB B2 to "1" and supplies the digital signals B1 through B6 ("110000") to the sequential comparison register 5. For example, the second LSB B2 is set to 3.75 V which is ¾ the sum of the maximum and minimum voltages of the analog signal output from the D/A converter circuit 9. On the other hand, when the comparison result REFS is "1", the control circuit 4 sets the MSB B1 to "0" and the second MSB B2 to "1" and supplies the digital signals B1 through B6 ("010000") to the sequential comparison register 5. For example, the second MSB B2 is set to 1.25 V which is ¼ the sum of the maximum and minimum voltages of the analog signal output from the D/A converter circuit 9.

[10] The digital input part 14 applies voltages respectively corresponding to the digital signals B1 through B6 to the electrodes X1 through X6. As a result, a negative charge of a quantity equal to the total charge stored a the electrodes X1 and X2 is stored at the electrode Y1, and the total charge stored at the electrodes Y1 through Y6 raises or lowers the voltage at the electrodes Y1 through Y6 depending on the relationship with the total charge stored at the electrodes X1 through X6. The comparator part 13 supplies the comparison result REFS to the control circuit 4 based on the relationship of the voltage at the electrodes Y1 through Y6 and the threshold voltage of the inverter IV1.

[11] Next, a description will be given of third through sixth comparisons of the analog input signal and the digital value received from the sequential comparison register 5. The comparison is repeated for 3, 4, 5 and 6 bits based on the comparison result REFS from the comparator part 3, similarly as in the case of the operations (7) and (8) described above. When six comparisons to the LSB B6 ends, the control circuit 4 stores the digital signals B1 through B6 at the time when the comparison ends into the output storage register 6 via the sequential comparison register 5. For example, the digital signals B1 through B6 which are stored in the output storage register 6 are used as data of a microcomputer (not shown).

The above described operations correspond to one A/D conversion which is made up of the initializing time and the A/D conversion cycle. After the A/D conversion cycle, the initializing operation is carried out during another initializing time before the next A/D conversion cycle starts.

By providing the initializing time before each A/D conversion cycle, the voltage at the electrodes X1 through X6 changes quickly to the reference voltage in the same manner regardless of whether the analog input voltage changes to the maximum or minimum voltage, that is, from 0 to 5 V or from 5 to 0 V, as will be described hereafter.

During the sampling time M1, the analog input voltage is 5 V as shown in FIG.6(A), and the analog input voltage of 5 V is held at the electrodes X1 through X6 at the end of the sampling time M1. Thereafter, during the sequential comparison time ml, the held analog input voltage of 5 V is subjected to the sequential comparison. During the sampling time Ml, the analog input voltage applied to the channel ch2 changes to 0 V.

Figures 3A, 3B, 3C:
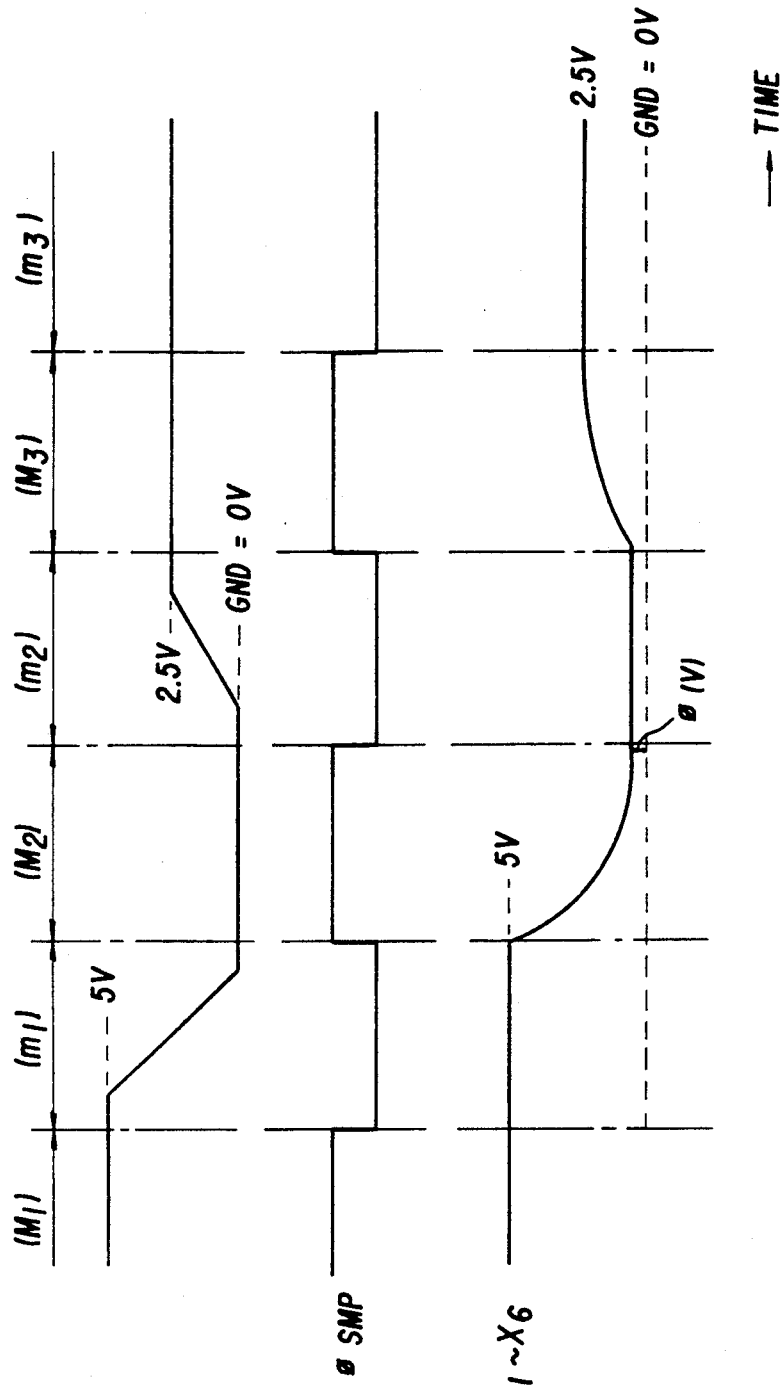
FIG.3 is a timing chart for explaining the problems of the A/D converter shown in FIG.2.

Conventionally, the next sampling time M2 is started immediately after the sequential comparison time m1. Hence, the charge corresponding to the analog input voltage held at the end of the sequential comparison time ml is discharged as shown in FIG.3(C) under the suppression caused by the sensor 10 in the discharge path when the analog input voltage of 0 V is input to the A/D converter.

However, in this embodiment, the initializing time R1 is provided before the sampling time M1, and the charge held at the electrodes X1 through X6 is forcibly discharged so that the voltage at the electrodes X1 through X6 becomes the reference voltage which is 2.5 V in this case. Accordingly, as shown in FIG.6(D), the ch voltage at the electrodes X1 through X6 instantaneously changes to the reference voltage, and the potential difference between the reference voltage and the analog input voltage of 0 V is only 2.5 V during the next sampling time M2. This means that the time required for the potential difference $\phi$ V shown in FIG.3(C) between analog input voltage of 0 V and the voltage corresponding to the charge held at the electrodes X1 through X6 to become approximately 0 V during the sampling time M2 is extremely short in this embodiment.

Thereafter, during the next sequential comparison time m2, the analog input voltage applied to the channel ch2 changes to 2.5 V. During the initializing time R2, the voltages at the electrodes X1 through X6 and the electrodes Y1 through Y6 are respectively initialized to 2.5 V by the initial setting circuit 7. Hence, during the next sampling time M3, the voltage at the electrodes X1 through X6 is 2.5 V as shown in FIG.6(C) which is the same as the reference voltage and the analog input voltage applied to the channel ch2.

Figure 7A:
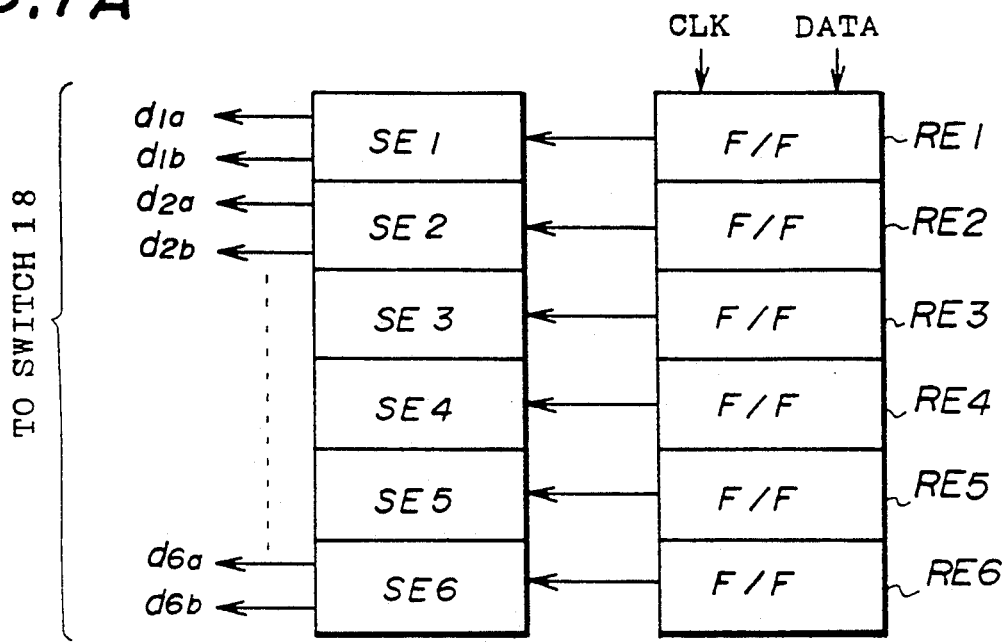
FIGS.7A and 7B are system block diagrams showing embodiments of an initial setting circuit of the first embodiment.
Figure 7B:
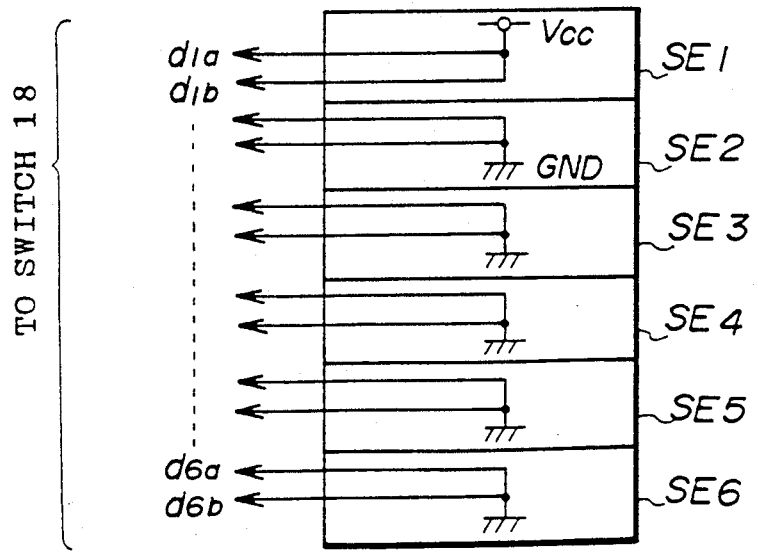

FIGS.7A and 7B show embodiments of the initial setting circuit 7 of the first embodiment.

In FIG.7A, the initial setting circuit 7 includes flip-flops RE1 through RE6 and selectors SE1 through SE6 which are connected as shown. The flip-flops RE1 through RE6 form a 6-bit shift register.

For example, an initial value data DATA which is specified by a microcomputer (not shown) is input to the shift register in response to a clock CLK. The initial value data DATA is formed by digital signals which are "0" or "1". A value which is set in the shift register is "100000" when the initial value data DATA is 2.5 V which is ½ the voltage range of 0 to 5 V of the analog input voltage which is input to the A/D converter. On the other hand, a value "010000" is set in the shift register when the initial value data DATA is 1.25 V which is ½ the voltage range of 0 to 2.5 V of the analog input voltage which is input to the A/D converter.

The selectors SE1 through SE6 respectively receive the output values of the corresponding flip-flops RE1 through RE6 of the shift register, and generate the digital control signal pairs d1a and d1b through d6a and d6b. For example, when the output value of the flip-flop RE1 is "1", the selector SE1 outputs low-level digital control signals d1a and d1b. On the other hand, when the output value of the flip-flop RE1 is "0", the selector SE1 outputs high-level digital control signals d1a and d1b. The digital control signal pairs d1a and d1b through d6a and d6b are supplied to the switch 18 shown in FIG.5. Of course, the levels of the digital control signals generated in the selectors SE1 through SE6 may be arbitrarily selected depending on the structure of the digital input part 14.

When the digital control signals d1a through d6a and d1b through d6b are generated using the flip-flops RE1 through RE6 of the shift register and the selectors SE1 through SE6, it becomes possible to quickly set the reference voltage to $\frac{1}{2}$ the voltage range of the analog input voltage which is input to the A/D converter, even when the A/D converter is provided on a single chip together with a microcomputer and the analog input voltage has an arbitrary voltage range within the tolerable voltage range of the A/D converter. In other words, when the A/D converter is provided on a single chip together with the microcomputer, the voltage range of the analog input voltage input to the A/D converter is set to 0 to 5 V, the reference voltage is set to 2.5 V and the voltage range of the analog voltage which is output from the sensor 10 or the like which is coupled externally to the A/D converter is set to 0 to 3 V, the reference voltage cannot be set to 1.5 V which is $\frac{1}{2}$ the voltage range of the analog voltage which is output from the sensor 10 or the like. However, by using the shift register as in this embodiment of the initial setting circuit 7, the reference voltage can be set arbitrarily by changing the contents of the shift register based on the instruction from the microcomputer.

In FIG.7B, the initial setting circuit 7 includes selectors SE1 through SE6 which generate fixed digital control signals corresponding to the reference voltage. In other words, the reference voltage is fixed and cannot be changed in this embodiment of the initial setting circuit 7, but the digital control signals d1a through d6a and d1b through d6b are generated by simply connecting the lines to the power source voltage Vcc or the ground voltage GND within the selectors SE1 through SE6. Therefore, the circuit construction is extremely simple in this embodiment of the initial setting circuit 7.

In the embodiment of the initial setting circuit 7 shown in FIG.7A, a flip-flop of the shift register and a selector are provided with respect to each but of the digital control signal which is supplied to the digital input part 14. However, it is possible to modify this structure so that only arbitrary bits of the digital control signal can be set. In this case, when the tolerable voltage range of the input analog voltage which may be supplied to the A/D converter is 1 to 5 V and the actual voltage range of the input analog voltage input to the A/D converter is 1 to 2.5 V, the reference voltage for the initial operation may be 1.25 V. Hence, in this case, only the flip-flops RE3 through RE6 of the shift register corresponding to the lower three bits need to be provided, thereby making it possible to reduce the number of flip-flops and simplify the circuit structure of the initial setting circuit 7.

In the first embodiment of the A/D converter according to the present invention, the initializing time R1 is provided after the sequential comparison time m1, and the charge held at the electrodes X1 through X6 are forcibly charged or discharged so that the voltage at the electrodes X1 through X6 becomes the reference voltage (2.5 V). Accordingly, during the next sampling time M2, the potential at the electrodes X1 through X6 need only change from the reference voltage to the analog input voltage which is not greatly different from the reference voltage. The reference voltage may be set arbitrarily, but the reference voltage is preferably $\frac{1}{2}$ the voltage range of the analog input voltage. By setting the reference voltage to $\frac{1}{2}$ the voltage range of the analog input voltage, it becomes possible to quickly change the voltage at the electrodes X1 through X6 to the reference voltage in the same manner regardless of whether the analog input voltage changes to the maximum or minimum voltage, that is, from 0 to 5 V or from 5 to 0 V, and the initializing time R1 can thus be made short.

In addition, the initializing time occurs immediately before each sampling time in the first embodiment. However, it is possible to provide the initializing time immediately after each A/D conversion. In this case, however, the charge held within the S/H circuit 2 cannot be initialized when making the first A/D conversion.

The first embodiment is particularly suited for application to the sequential comparison type A/D converter proposed in a Japanese Published Patent Application No.2-25295 because the setting of the initial setting circuit is facilitated. In other words, when an additional register is provided exclusively for making an auxiliary comparison with respect to a register SAR in the proposes A/D converter, it is possible to carry out a control and use this additional register as the initial setting circuit during the initializing time. In addition, when the upper 2 bits of the digital signal used for the auxiliary comparison are "1", it is simply necessary to carry out a control so that the value of the second most significant bit is changed from "1" to "0".

Figure 8:
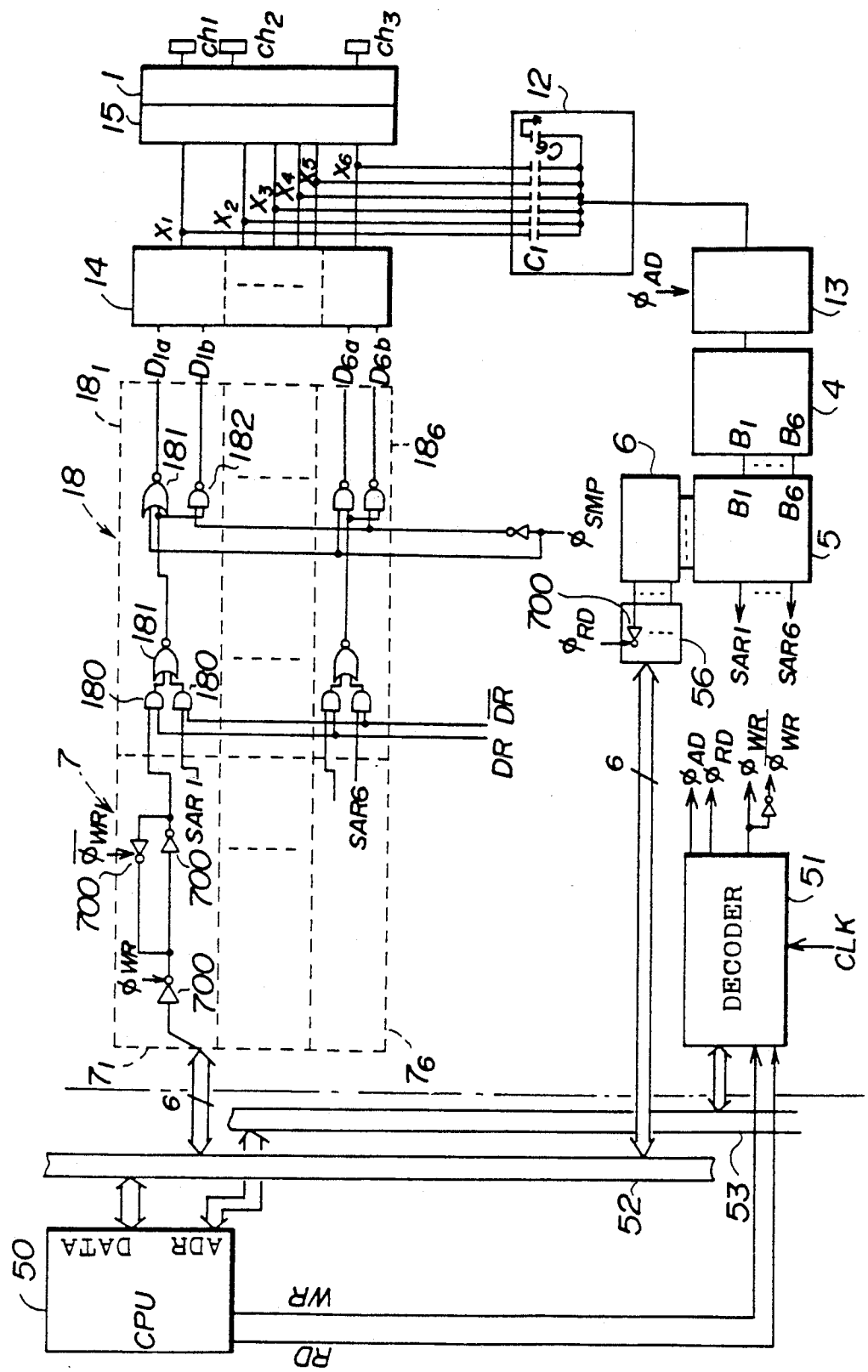
FIG.8 is a system block diagram showing a second embodiment of the A/D converter according to the present invention.

Next, a description will be given of a second embodiment of the A/D converter according to the present invention, by referring to FIG.8. In FIG.8, those parts which are essentially the same as those corresponding parts in FIG.5 are designated by the same reference numerals, and a description thereof will be omitted.

In FIG.8, the A/D converter is shows on the right of a one-dot chain line, and this A/D converter is coupled to a central processing unit (CPU) 50 via a data bus 52 and an address bus 53. For example, the A/D converter and the CPU 50 are provided on a single LSI chip. The A/D converter includes a decoder 51. The decoder 51 receives read and write signals RD and WR and an address signal from the CPU 50 and a system clock CLK. Based on these signals, the decoder 51 generates a start clock $\phi_{AD}$ shown in FIG.12(H), a read clock $\phi_{RD}$ and a write clock $\phi_{WR}$. The decoder 51 makes the necessary decoding to enable desired circuit parts of the A/D converter. The sampling pulse $\phi_{SMP}$ is generated based on the start clock $\phi_{AD}$. The output storage register 6 is coupled to the data bus 52 via a buffer 56 so that the data stored in the output storage register 6 may be output to the data bus 52.

Figure 12:
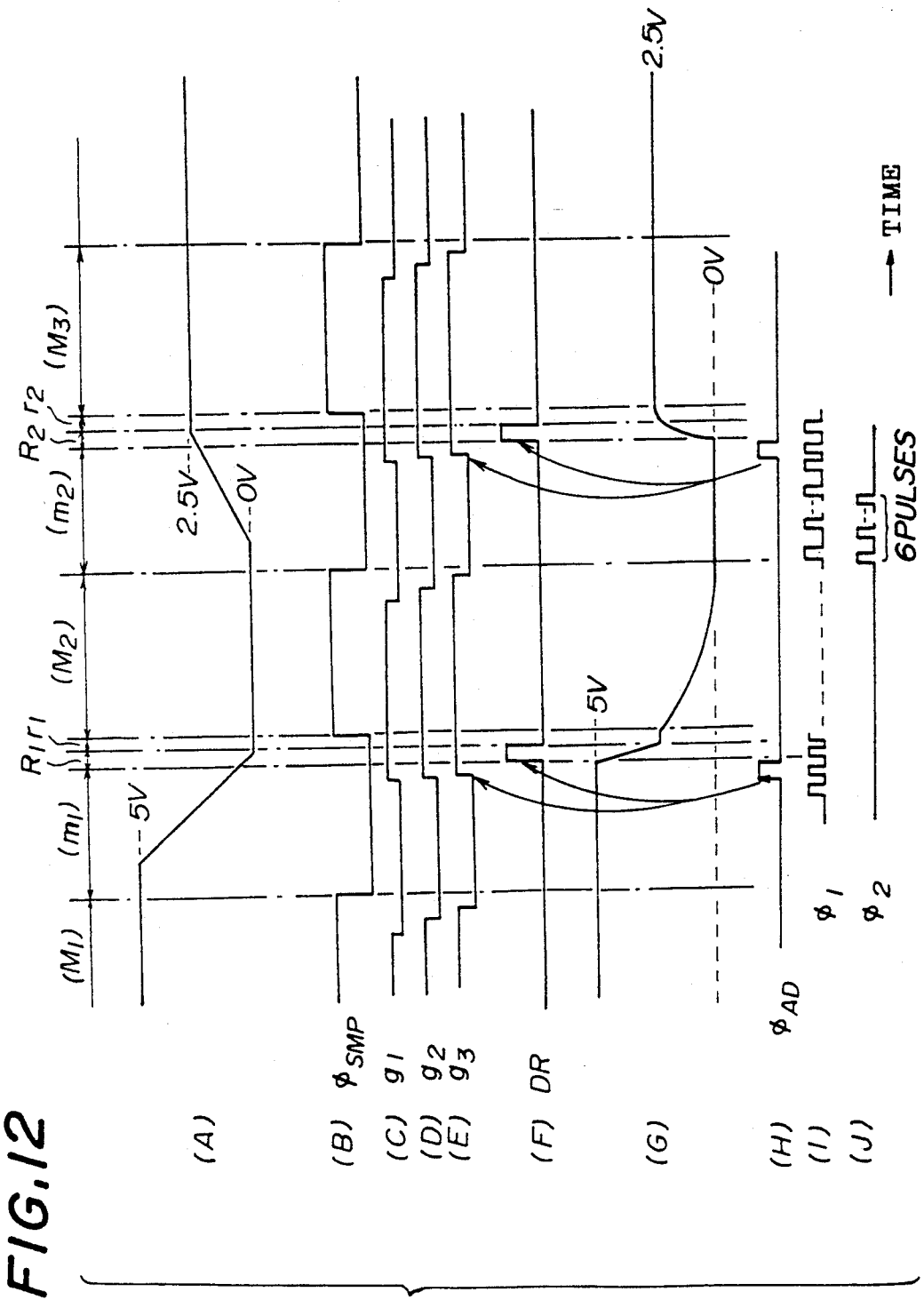
FIG.12 is a timing chart for explaining the operation of the second embodiment.

The sampling pulse $\phi_{SMP}$ and the initializing pulse DR may be generated from the CPU 50, from the decoder 51, or from a timing generator (not shown). The sampling pulse $\phi_{SMP}$ is shown in FIG.12(B), and the initializing pulse DR is shown in FIG.12(F).

Figure 9A:
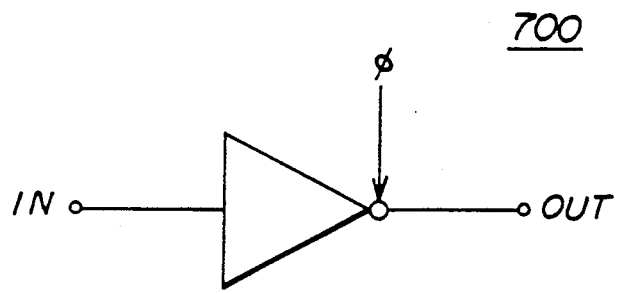
FIGS.9A and 9B are circuit diagrams for explaining the circuit structure of an element shown in FIG.8.
Figure 9B:
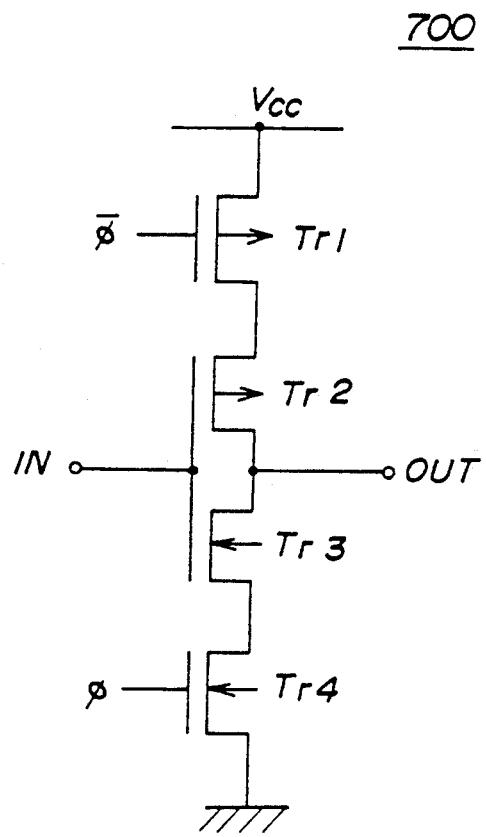

The initial setting circuit 7 is made up of circuit parts $7_1$ through $7_6$, and only the circuit construction of the circuit part $7_1$ is shown in FIG.8 for the sake of convenience. The circuit part $7_1$ includes three elements 700 which are connected as shown. The circuit parts $7_1$ through $7_6$ receive initializing data for determining the potentials at the electrodes X1 through X6 of the capacitors C1 through C6, and the initializing data are received from the CPU 50 via the data bus 52. The switch 18 is made up of circuit parts $18_1$ through $18_6$, and only the circuit construction of the circuit part $18_1$ is shown for the sake of convenience. The circuit part $18_1$ includes two AND gates 180, two NOR gates 181 and one NAND gate 182 which are connected as shown. In FIG.8, each element 700 shown in FIG.9A has a circuit construction shown in FIG.9B which includes four transistors Tr1 through Tr4.

Figure 10:
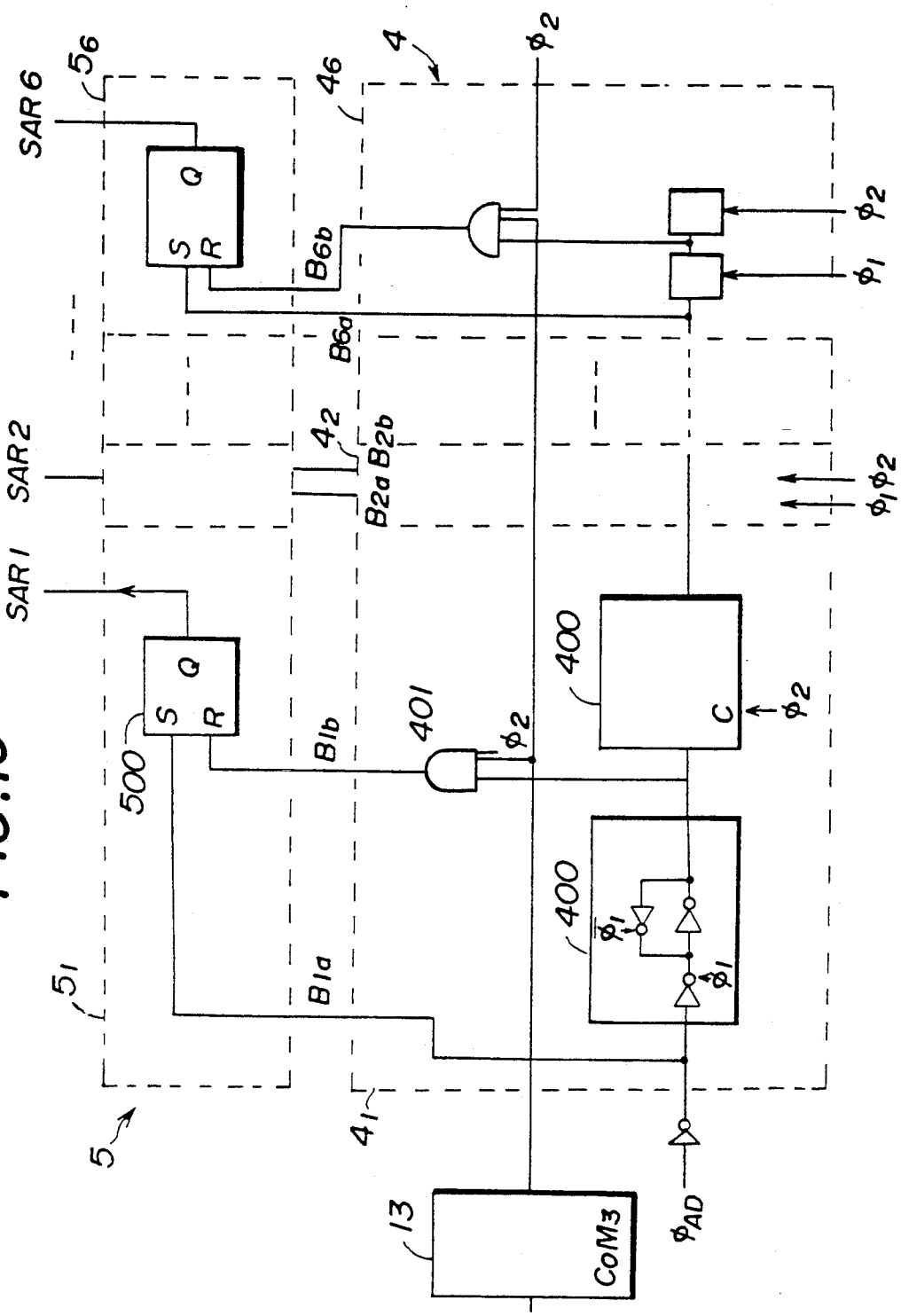
FIG.10 is a circuit diagram showing the control circuit and the sequential comparison register of the second embodiment.

FIG.10 shows the control circuit 4 and the sequential comparison register 5 which are shown in FIG.8 in more detail. The control circuit 4 is made up of circuit parts $4_1$ through $4_6$, and only the circuit construction of the circuit parts $4_1$ and $4_6$ is shown for the sake of convenience. Each circuit part of the control circuit 4 includes two latch circuits 400 and an AND gate 401 which are connected as shown. Each latch circuit 400 includes three elements which are basically the same as the element 700 described above. Every time one bit is compared, the high-level start signal $\phi_{AD}$ is successively latched and shifted from the latch circuit 400 of the circuit part $4_i$ to the latch circuit 400 of the circuit part $4_{i+1}$, where i=1 to 6. Hence, the results of six comparisons are output in response to six pulses of the clock $\phi_2$.

On the other hand, the sequential comparison register 5 is made up of circuit parts $5_1$ through $5_6$, and only the circuit construction of the circuit parts $5_1$ and $5_6$ is shown for the sake of convenience. Each circuit part of the sequential comparison register 5 includes a set-reset flip-flop 500. Digital control signals SAR1 through SAR6 are respectively output from the circuit parts $5_1$ through $5_6$ of the sequential comparison register 5. In this embodiment, the digital control signals SAR1 through SAR6 respectively correspond to the digital control signals D1a through D6a of the second embodiment, and no digital control signals corresponding to the digital control signals D1b through D6b are output in this embodiment.

Clocks $\phi_1$ and $\phi_2$ may be generated from the CPU 50, from the decoder 51, or from a timing generator (not shown). The clocks $\phi_1$ and $\phi_2$ are respectively shown in FIG.12(I) and 12(J).

Figure 11:
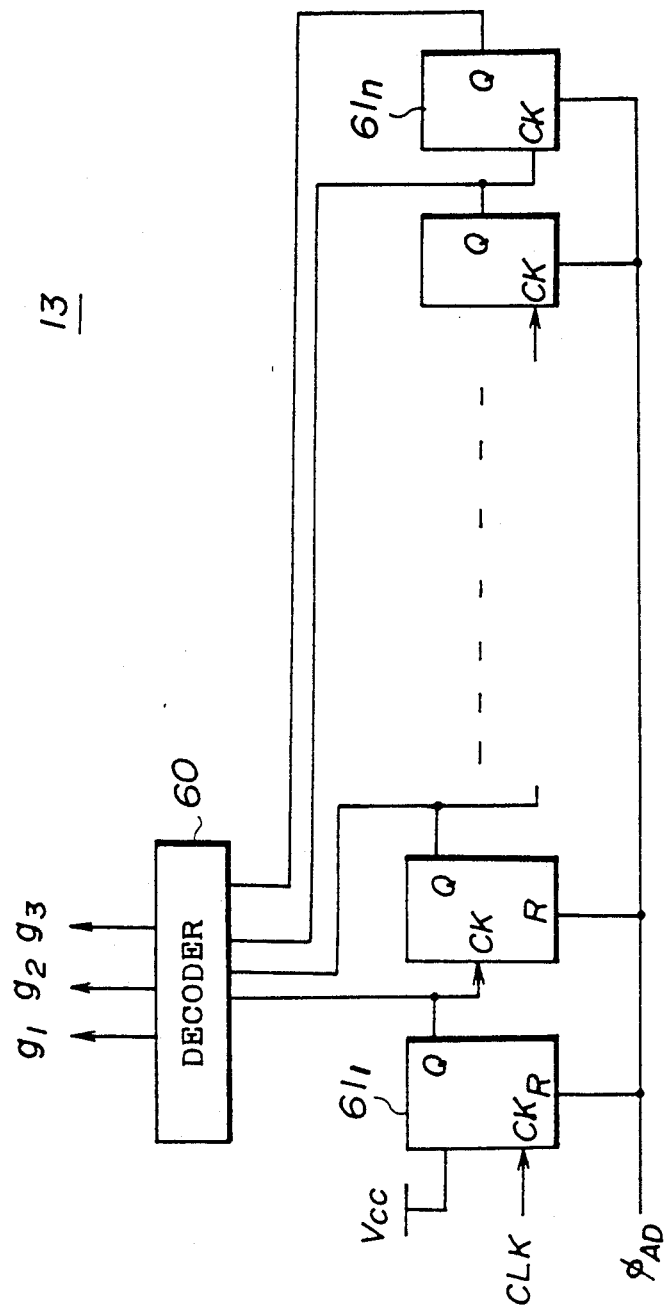
FIG.11 is a circuit diagram showing an essential part of the comparator part of the second embodiment.

FIG.11 shows an essential part of the comparison part 13 which is shown in FIG.8 in more detail. The comparison part 13 shown in FIG.11 includes a decoder 60 and n flip-flops $61_1$ through $61_n$ which are connected as shown. A clock $\phi_{AD}$ is supplied to reset terminals R of each of the flip-flops $61_1$ through $61_n$, and the system clock CLK is applied to the flip-flop $61_1$ provided in the first of the n stages. The decoder 60 decodes outputs of the flip-flops $61_1$ through $61_n$ and outputs comparator part control signals g1 through g3 which are applied to the gate electrodes G1 through G3 of the transistors N7 through N9 within the comparator part 13 shown in FIG.5. The comparator part control signals g1 through g3 are respectively shown in FIG.12(C) through 12(E).

FIG.12(A), 12(B), 12(F) and 12(G) respectively correspond to FIG.6(A), 6(B), 6(C) and 6(D), and a description thereof will be omitted.

Figure 13:
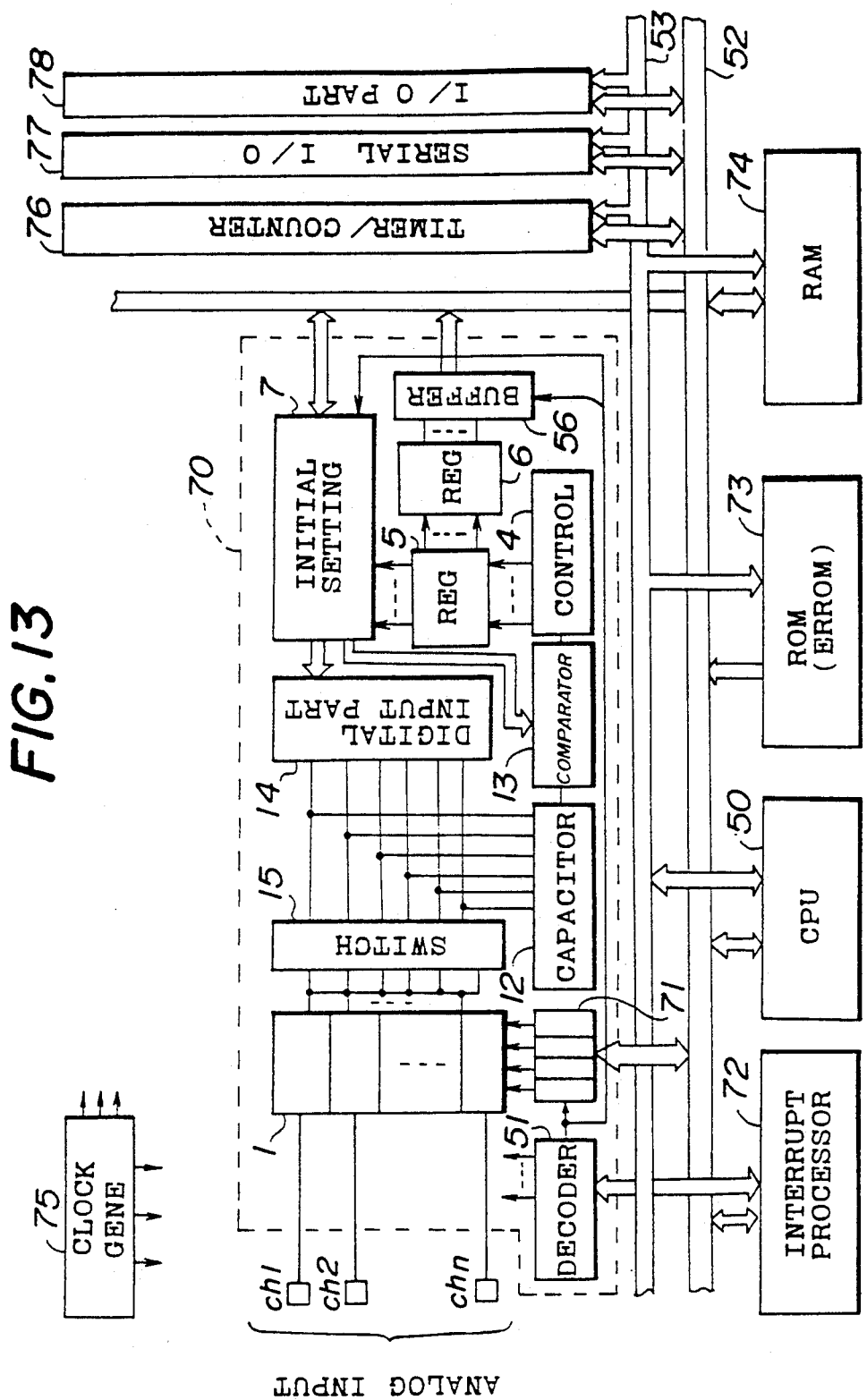
FIG.13 is a system block diagram showing a third embodiment of the A/D converter according to the present invention.

Next, a description will be given of a third embodiment of the A/D converter according to the present invention, by referring to FIG.13. In FIG.13, those parts which are the same as those corresponding parts in FIG.8 are designated by the same reference numerals, and a description thereof will be omitted. FIG.13 shows an LSI chip which includes an A/D converter 70, a CPU 50, an interrupt processor 72, a read only memory (ROM) 73, a random access memory (RAM) 74, a clock generator 75, a timer/counter 76, a serial input/output interface 77 and an input/output port 78 which are coupled via a data bus 52 and an address bus 53. The clock generator 75 generates various clocks which are used within the LSI chip.

The A/D converter 70 includes a multiplexer 1, a switch 15, a digital input part 14, an initial setting circuit 7, a buffer 56, an output storage register 6, a sequential comparison register 5, a control part 4, a comparator part 13, a capacitor part 12, a latch circuit 71 and a decoder 51 which are connected as shown. The decoder 51 decodes read and write signals and the address from the CPU 50 and generates various clocks based on these signals. The latch circuit 71 latches channel selection data from the CPU 50 in response to the clock from the decoder 51, and the latched data from the latch circuit 71 is supplied to the multiplexer 1 as a channel selection signal for selecting a desired channel.

The initializing operation of the initial setting circuit 7 may be carried out before each A/D conversion starts for each of the channels ch1 through chn. Alternatively, the initializing operation may be carried out immediately after the power source Vcc for the LSI chip is turned ON.

The initializing operation may be made in various manners, and a description will now be given of embodiments of the initializing operation.

Figure 14A:
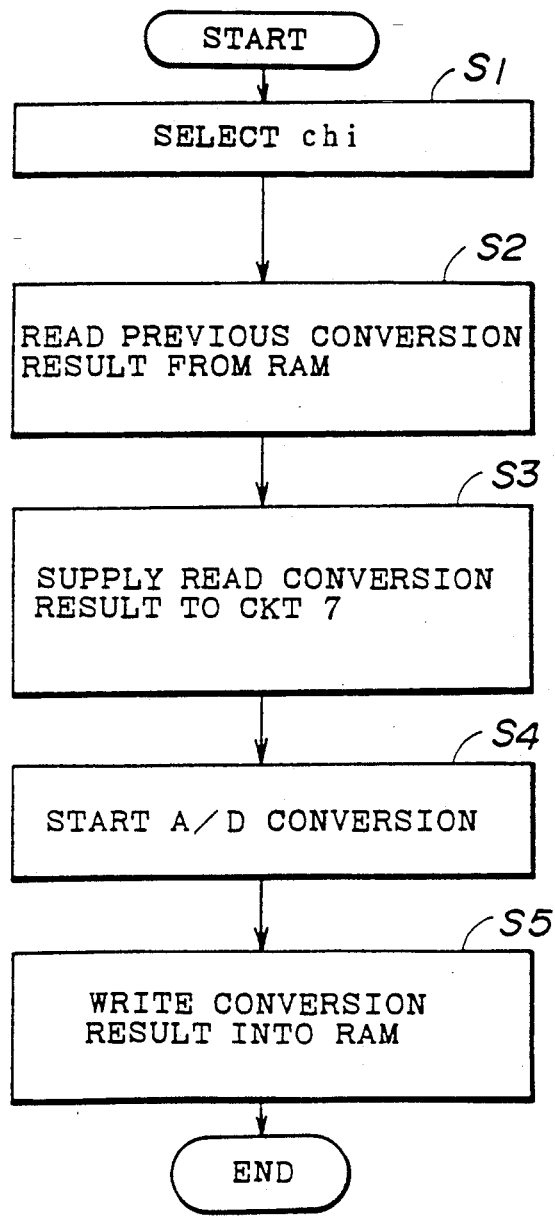
FIGS.14A through 14D respectively are flow charts showing embodiments of the initializing operation of the third embodiment.

According to the initializing operation shown in FIG.14A, the CPU 50 selects a channel chi out of the channels ch1 through chn in a step S1 by supplying channel selection data from the CPU 50 to the latch circuit 71 via the data bus 52. The channel selection data is latched by the latch circuit 71 and is supplied to the multiplexer 1 as the channel selection signal which selects the channel chi. The CPU 50 reads a previous conversion data for the channel chi from an ith region of the RAM 74 via the data bus 52 in a step S2. Then, the CPU 50 supplies the read previous conversion data to the initial setting circuit 7 via the data bus 52 in a step S3. The A/D conversion is started in a step S4, and the CPU 50 reads the converted result which is stored in the output storage register 6 via the buffer 56 and the data bus 52 in a step S5. In addition, the CPU 50 stores the converted result into the ith region of the RAM 74 via the data bus 52, and the process ends. The above described process is carried out for arbitrary channels.

Hence, according to the initializing operation shown in FIG.14A, the initial voltage at the electrodes X1 through X6 of the capacitors C1 through C6 is first set to an average or center voltage of the voltage range of the analog input voltage which is supplied to the A/D converter. The conversion result of the first A/D conversion is stored in the RAM 74, and this stored conversion result is used as the initial voltage when making the second A/D conversion. This initializing operation is particularly effective in obtaining an accurate conversion result when the voltage change of the analog input voltage is relatively small.

Figure 14B:
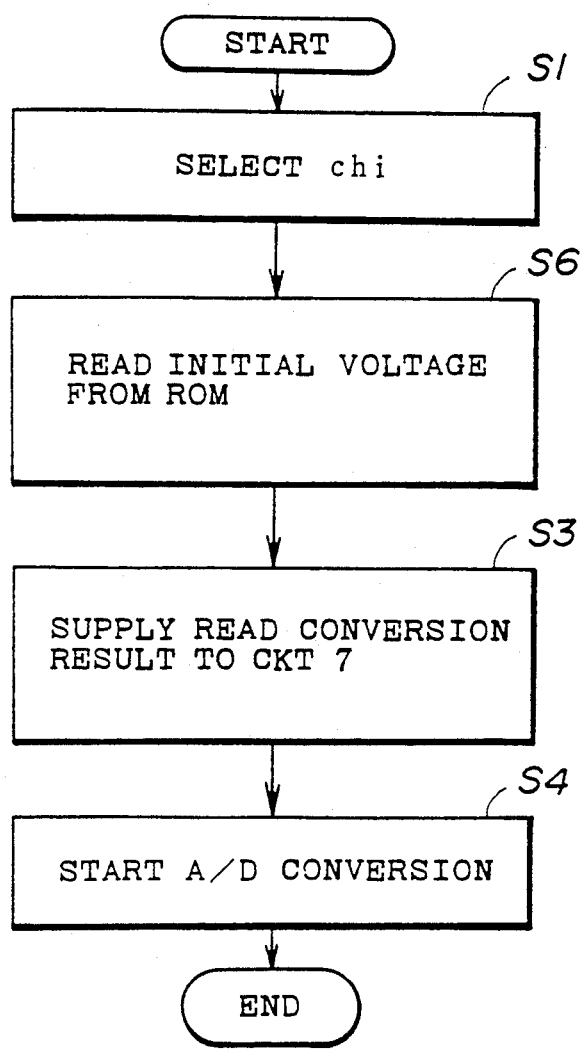

According to the initializing operation shown in FIG.14B, the average or center voltage of the analog input voltage is prestored in the ROM 73 for all the channels ch1 through chn. The average or center voltage of the analog input voltage can be prestored for all the channels ch1 through chn because the voltage range of the analog input voltage received at each channel is usually known. In other words, the user often fixedly uses certain channels for receiving predetermined signals. In FIG.14B, those steps which are the same as those corresponding steps in FIG.14A are designated by the same reference numerals, and a description thereof will be omitted.

In FIG.14B, a step S6 is carried out after the step S1. The CPU 50 reads the initial voltage for the channel chi from an ith region of the ROM 73 via the data bus 52 in the step S6. The steps S3 and S4 are successively carried out after the step S6, and the process ends. The above described process is carried out for arbitrary channels.

Figure 14C:
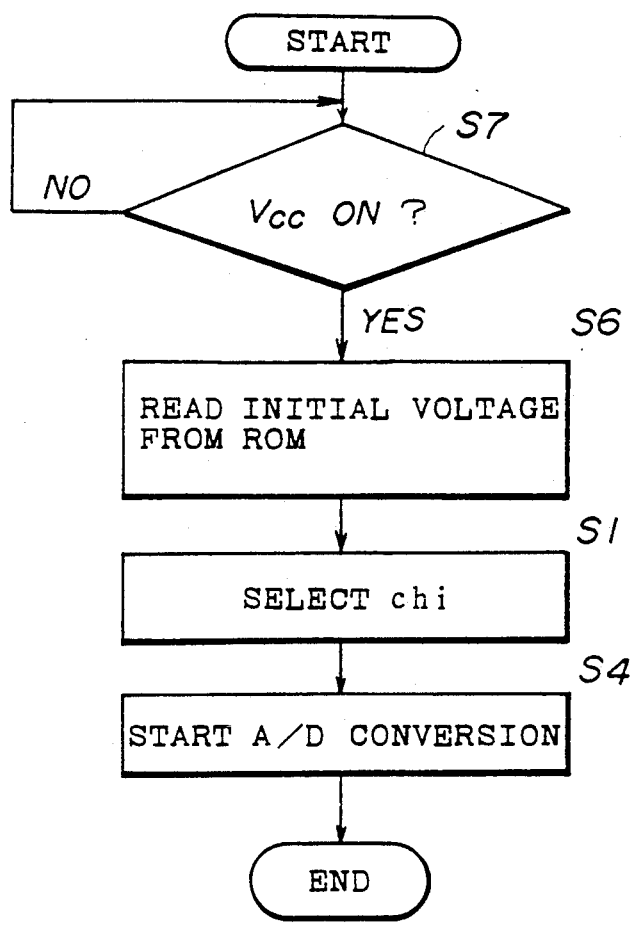

According to the initializing operation shown in FIG.14C, the average or center voltage of the analog input voltage is prestored in the ROM 73 for all the channels ch1 through chn, and the initializing operation is carried out immediately after the power source Vcc is turned ON. In FIG.14C, those steps which are the same as those corresponding steps in FIG.14A are designated by the same reference numerals, and a description thereof will be omitted.

In FIG.14C, the CPU 50 detects whether or not the power source Vcc is ON in a step S7. When the judgement result in the step S7 becomes YES, the steps S6, S1 and S4 are successively carried out and the process ends. The initial voltage is supplied to the initial setting circuit 7 only once at the beginning of the first A/D conversion, and the steps S1 and S4 are repeated thereafter. The above described process is carried out for arbitrary channels.

The initializing operation shown in FIG.14C is particularly effective when the change of the analog input voltage is relatively quick.

Figure 14D:
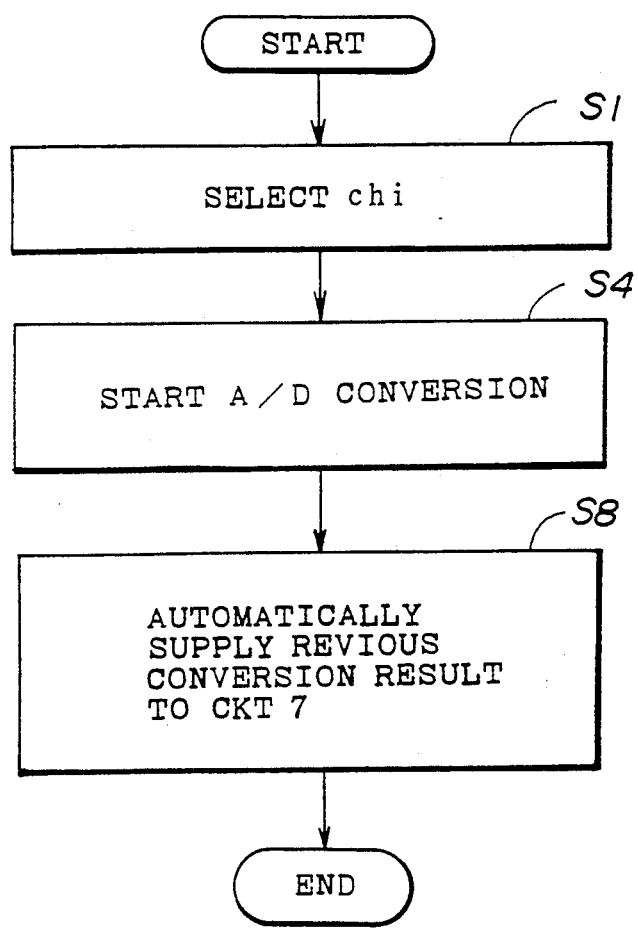

According to the initializing operation shown in FIG.14D, the previous conversion result is automatically supplied to the initial setting circuit 7 before the A/D conversion starts. In FIG.14D, those steps which are the same as those corresponding steps in FIG.14A are designated by the same reference numerals, and a description thereof will be omitted.

In FIG.14D, a step S8 is carried out after the steps S1 and S4. At the start of the A/D conversion, the data in the output storage register 6 is supplied to the initial setting circuit 7 without having to use the data bus 52 and the CPU 50. In other words, the step S8 automatically supplies the previous conversion result to the initial setting circuit 7 in the step S8 during at least the initializing time. The above described process is carried out for arbitrary channels.

Figure 15:
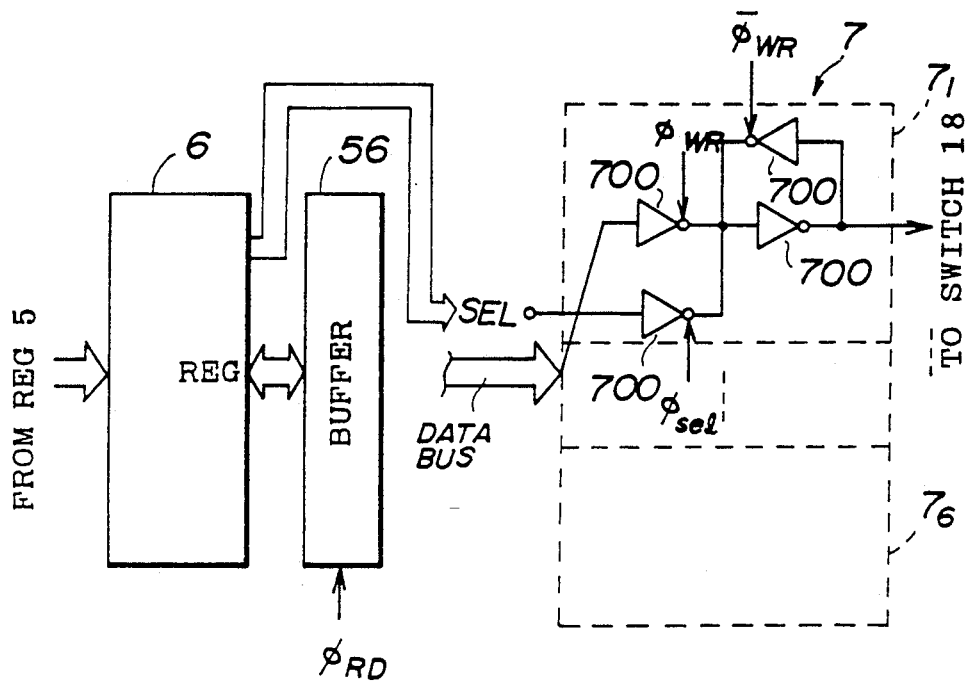
FIG.15 system block diagram showing an essential part of a fourth embodiment of the A/D converter according to the present invention.

Next, a description will be given of a fourth embodiment of the A/D converter according to the present invention, by referring to FIG.15. FIG.15 shows an essential part of the fourth embodiment. In FIG.15, those parts which are the same as those corresponding parts in FIG.8 are designated by the same reference numerals, and a description thereof will be omitted. According to this embodiment, it is possible to automatically set the initial voltage for desired channels based on the data stored in the output storage register 6.

Figure 16:
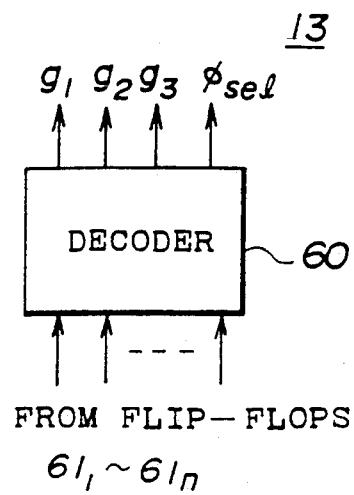
FIG.16 is a system block diagram showing an essential part of the comparator part of the fourth embodiment.
Figure 17:
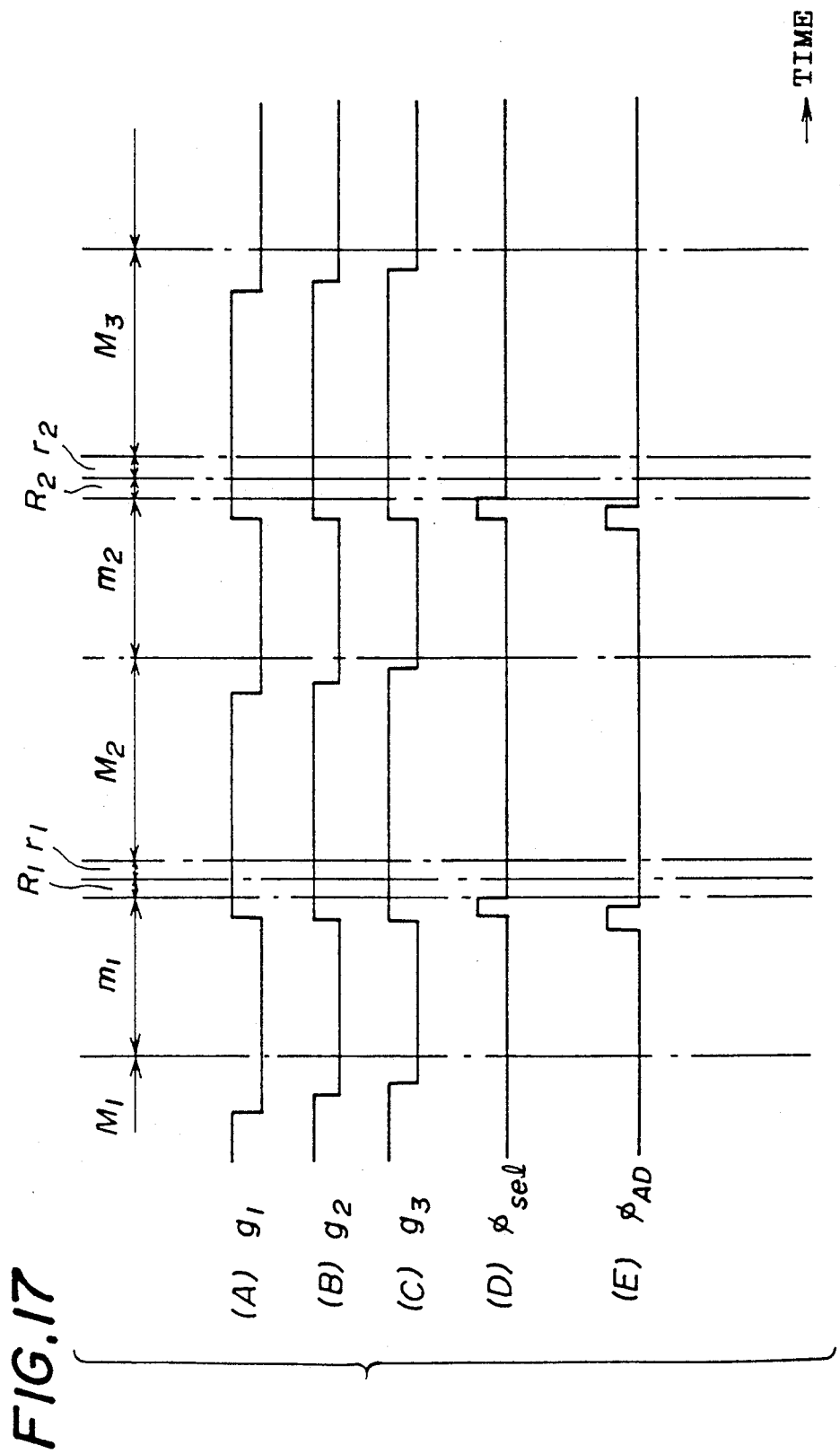
FIG.17 is a timing, chart for explaining the operation of the fourth embodiment.

In FIG.15, the initial setting circuit 7 is coupled to the output storage register 6, and a channel selection signal SEL and a clock $\phi_{sel}$ are supplied to the initial setting circuit 7. For example, the clock $\phi_{sel}$ may be generated from the decoder 60 of the comparator part 13 shown in FIG.11. FIG.16 shows an essential part of the comparator 13 of this embodiment, and FIG.17 shows the timings of the clock $\phi_{sel}$ together with the comparator part control signals g1 through g3 and the clock $\phi_{AD}$.

According to this embodiment, it is possible to considerably reduce the sampling time for the second and subsequent A/D conversions. In addition, it is possible to omit comparison of predetermined upper bits for the second and subsequent A/D conversions and compare only the lower bits in the second and subsequent A/D conversions. By repeating such an operation, it is possible to make more accurate comparisons. For example, the first A/D conversion may convert the first through fourth MSBs to make a rough conversion, the second A/D conversion may convert the third through tenth MSBs to make a standard conversion, and the third A/D conversion may convert the fifth through tenth MSBs to make a fine conversion.

Figure 18:
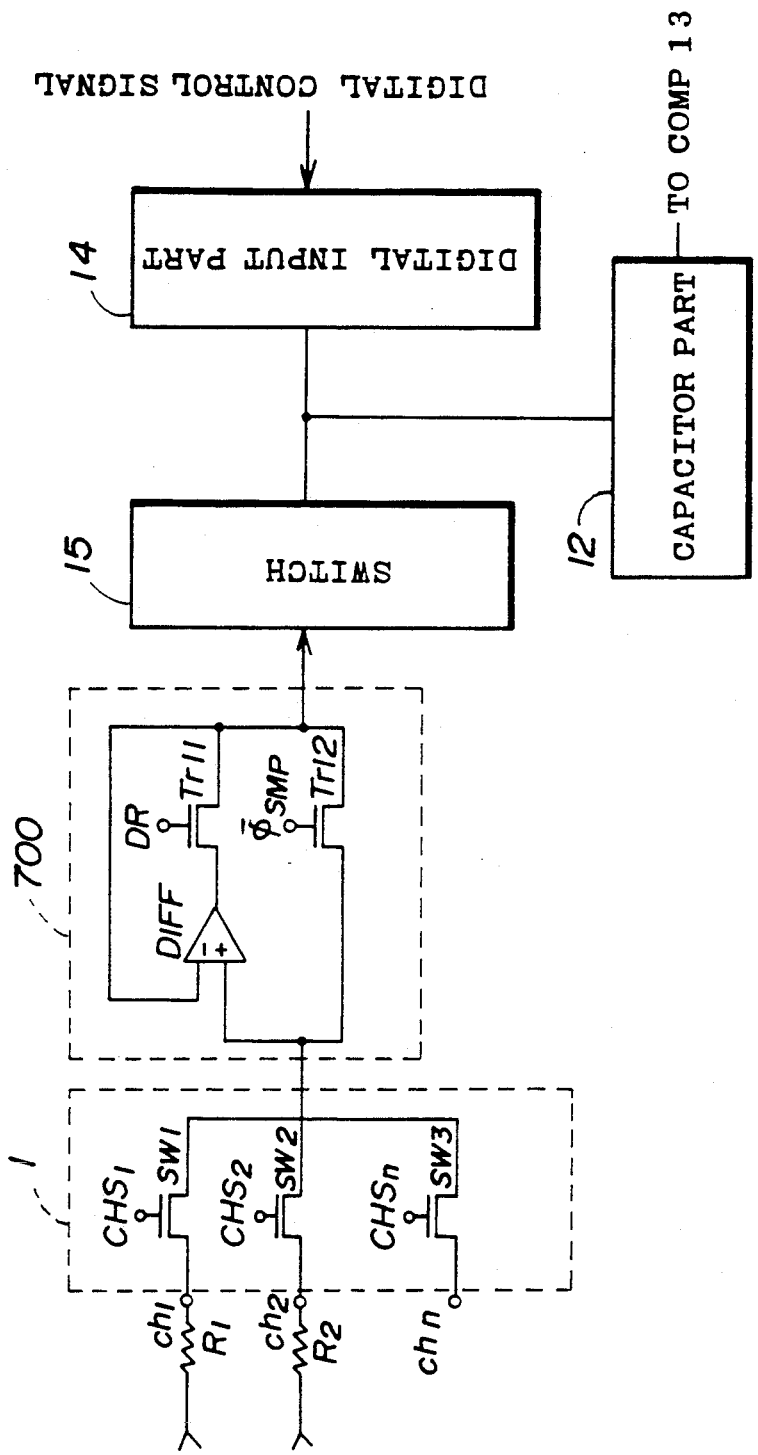
FIG.18 is a system block diagram showing an essential part of a fifth embodiment of the A/D converter according to the present invention.

Next, a description will be given of a fifth embodiment of the A/D converter according to the present invention, by referring to FIG.18. In FIG.18, those parts which are the same as those corresponding parts in FIG.5 are designated by the same reference numerals, and a description thereof will be omitted.

In this embodiment, an initial setting circuit 700 is provided between the multiplexer 1 and the switch 15. The initial setting circuit 700 includes a differential amplifier DIFF having a gain of approximately one, and transistors Tr11 and Tr12 which are connected as shown. The transistor Tr11 is controlled by the initializing pulse DR, and the transistor Tr12 is controlled by an inverted signal $\overline{\phi}_{SMP}$ of the sampling pulse $\phi_{SMP}$. Outputs of the transistors Tr11 and Tr12 are fed back to a negative input terminal of the differential amplifier DIFF. The output of the multiplexer 1 is supplied to a positive input terminal of the differential amplifier DIFF.

Next, a description will be given of the operation of this embodiment for a case where the A/D conversion of the analog input signal received at the channel ch1 ends and the sampling of the analog input signal received at the channel ch2 starts. In this case, the capacitors C1 through C6 of the capacitor part 12 hold the potentials for the previous analog input signal received at the channel ch1.

First, the channel selection signal $CHS_2$ for selecting the channel ch2 becomes active, and the analog input signal received at the channel ch2 is output from the multiplexer 1. Since the capacitance of the internal wiring (interconnection) is small, there is essentially no change in the potential of the analog input signal. Then, the transistor Tr11 is turned ON responsive to the initializing pulse DR, and the charge corresponding to the analog input signal output from the multiplexer 1 is charged in the capacitors C1 through C6 of the capacitor part 12 via the switch 15. Because the gain of the differential amplifier DIFF is approximately one, it is possible to compensate for the error between the output potential of the initial setting circuit 700 and the potential at the electrodes X1 through X6 of the capacitors C1 through C6 by the feedback loop of the initial setting circuit 700.

The transistor Tr11 turns OFF responsive to the initializing pulse DR and the transistor Tr12 turns ON responsive to the inverted sampling pulse $\overline{\phi}_{SMP}$ when the potential at the electrodes X1 through X6 becomes the same as the output potential of the initial setting circuit 700. As a result, the charge accurately corresponding to the potential of the analog input signal received at the channel ch2 is held in the capacitors C1 through C6 of the capacitor part 12. Therefore, the potentials at the electrodes X1 through X6 need not be greatly changed in response to the analog input signal received at the channel ch2, and the sample and hold operation can be carried out within a short time even when the analog input signal supplied to the A/D converter is output from a circuit having a high impedance. In other words, there is no need to set the sample and hold time to a relatively long time even when the analog input signal supplied to the A/D converter is output from a circuit having a high impedance, and there is no need to sample the sane analog input signal a plurality of times.

Next, a description will be given of a sixth embodiment of the A/D converter according to the present invention. In this embodiment, a shift register is provided in addition to the latch circuit 71 shown in FIG.13 so that successive selection of the channels can be made. In other words, the desired channel selection signal from the CPU 50 is latched in one mode, and the shift register successively selects the channels in response to the channel selection signal (only one bit is "1" and the other bits are "0") from the CPU 50 in another mode.

Figure 19:
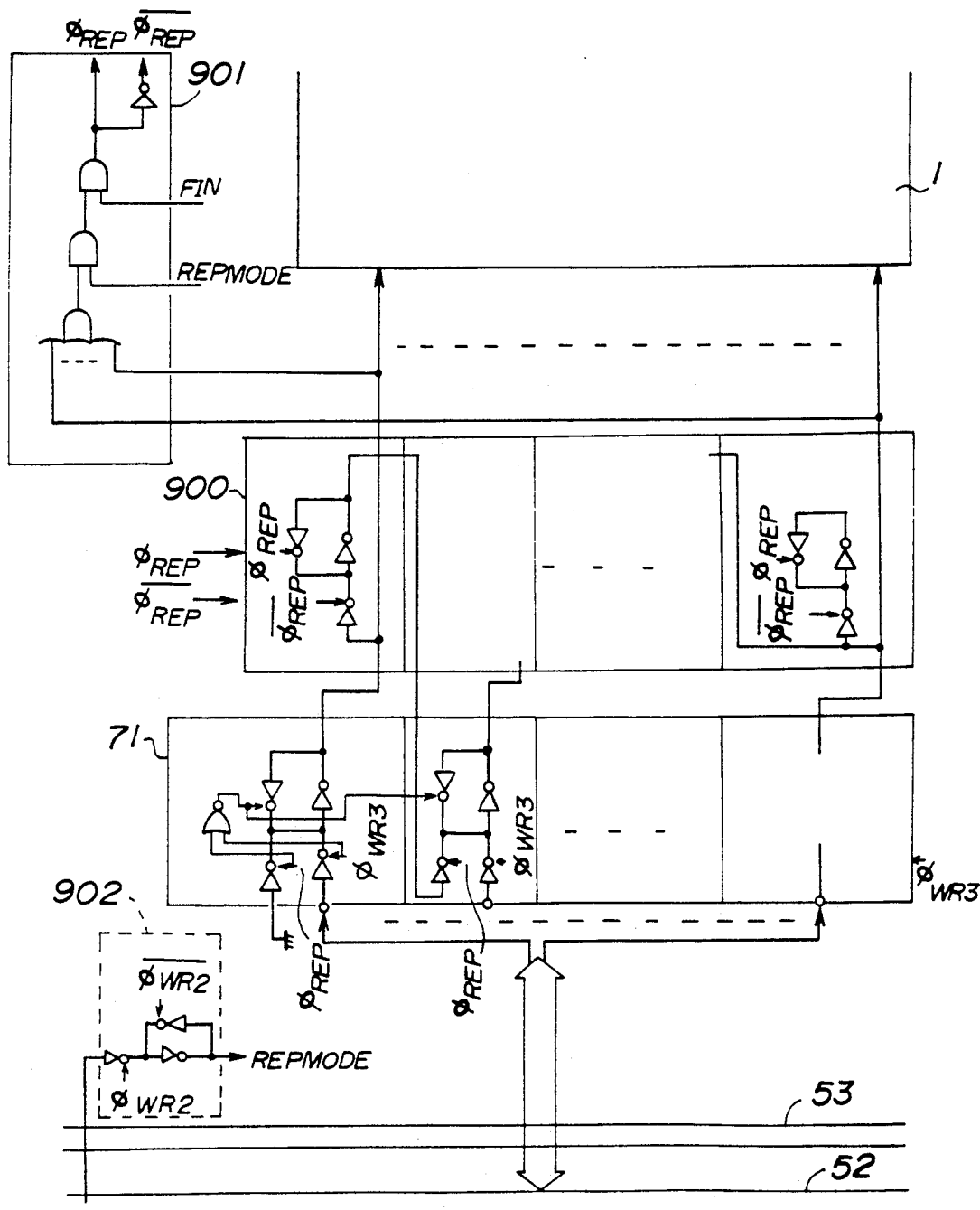
FIG.19 is a system block diagram showing an essential part of a sixth embodiment of the A/D converter according to the present invention.

FIG.19 shows an essential part of the sixth embodiment. In this embodiment, a shift register 900 is provided in addition to the latch circuit 71 shown in FIG.13, and the decoder 51 and the control circuit 4 are slightly modified from those shown in FIG.13. Essential parts of the latch circuit 71 and the shift register 900 have the structures shown in FIG.19, and clocks $\phi_{REP}$ and $\phi_{REP}$ are generated from a clock generator 901. A signal REPMODE is generated from a select signal generator 902. A signal FIN is generated from the control circuit 4.

Figure 20:
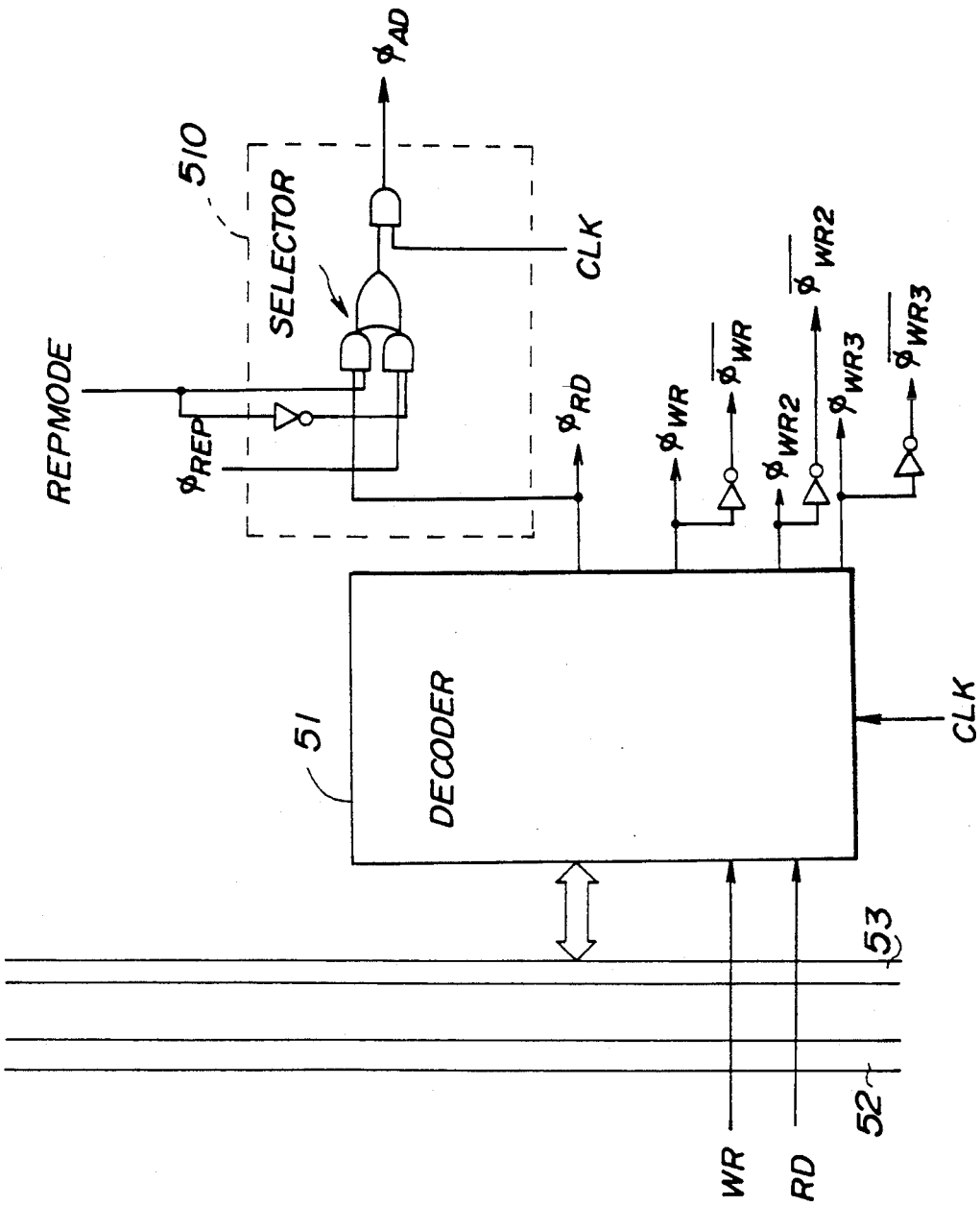
FIG.20 is a system block diagram showing a decoder of the sixth embodiment.

The latch circuit 71 which is coupled to the data bus 52 latches the channel selection data in response to a clock $\phi_{WR3}$ which is generated by the decoder 51. As shown in FIG.20, the clock $\phi_{WR3}$ is generated based on the address which is used by the CPU 50 to operate the latch circuit 71. A circuit part 510 for generating the start clock $\phi_{AD}$ may be a part of the decoder 51 or may be provided externally to the decoder 51 as shown in FIG.20. The output of the latch circuit 71 is supplied to the multiplexer 1.

On the other hand, the output of the latch circuit is supplied to the shift register 900 in response to the clock $\phi_{REP}$. The clocks $\phi_{REP}$ and $\phi_{REP}$ indicate the end of the A/D conversion in the shift register mode. Reponsive to these clocks $\phi_{REP}$ and $\phi_{REP}$, the data which is input to the latch circuit 71 from the CPU 50 is input to a latch part which forms the shift register 900. Hence, the value "0" is successively shifted via the inverter and the latch circuit 71, and it becomes possible to successively select the channels ch1 through chn.

The signal REPMODE which is generated by the select signal generator 902 determines whether the CPU 50 selects the channel by use of the output of the shift register 900 (shift register mode) or the CPU 50 directly selects the channel by use of the data output from the CPU 50 (direct selection mode). The signal REPMODE is generated from the select signal generator 902 based on the selection signal from the CPU 50 which is received via the data bus 52, in response to the clock $\phi_{WR2}$ from the decoder 51 shown in FIG.20.

Figure 21:
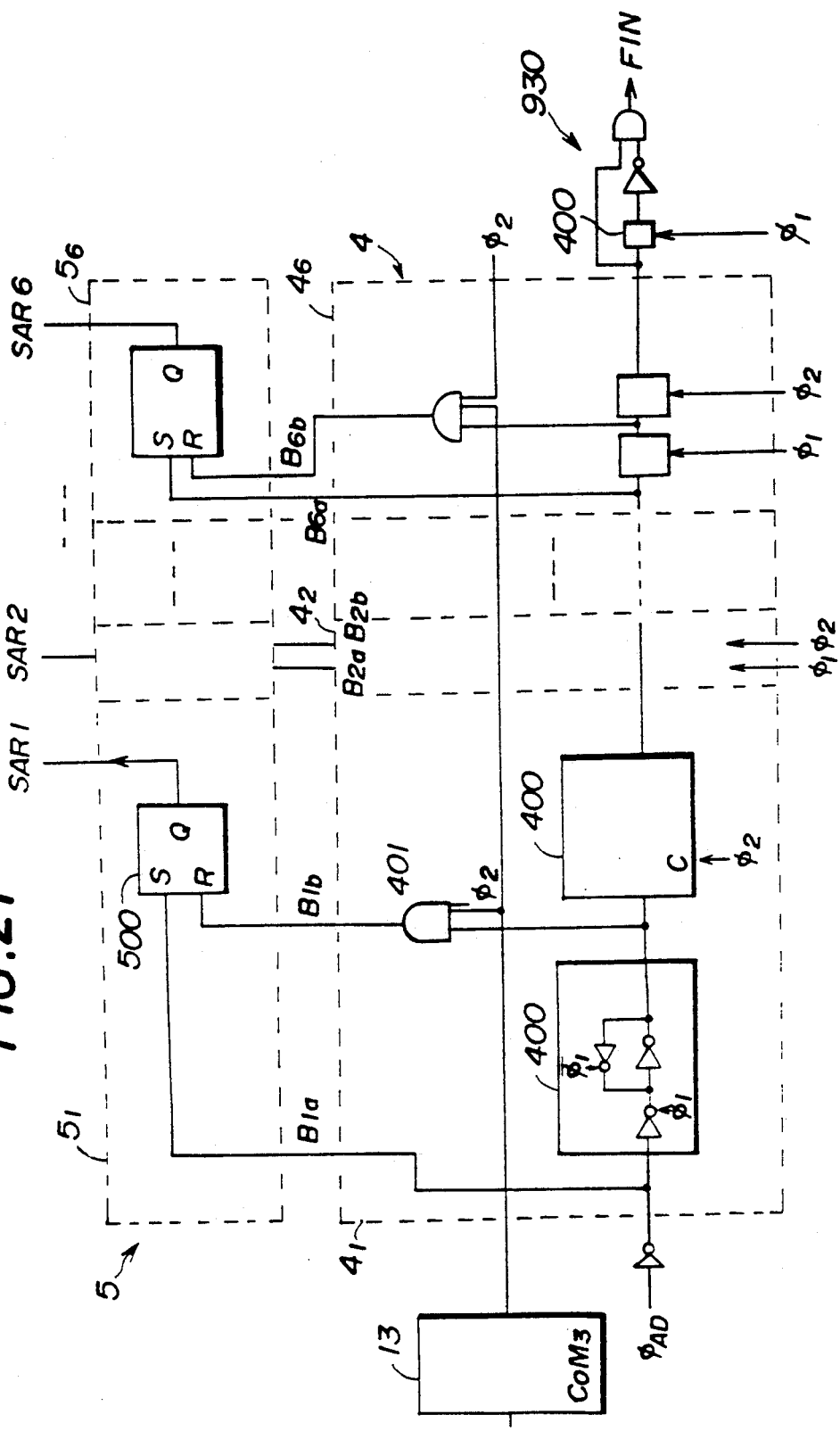
FIG.21 is a circuit diagram showing the control circuit and the sequential comparison register of the sixth embodiment.

The signal FIN is generated by a circuit part 930 which is connected to the circuit part 4₆ of the control circuit 4 as shown in FIG.21. In FIG.21, those parts which are the same as those corresponding parts in FIG.10 are designated by the same reference numerals, and a description thereof will be omitted. This signal FIN is generated based on the start clock $\phi_{AD}$ (= "1") which is successively shifted via the latch circuits 400, and has a constant pulse width. The clock $\phi_{REP}$ makes the output of a multi-input OR circuit of the clock generator 901 "1" when one of the outputs of the latch circuit 71 is "1". When the signal REPMODE is "1" to indicate the shift register mode, the clock generator 901 outputs the clocks $\phi_{REP}$ and $\phi_{REP}$ in response to the signal FIN which indicates the end of one A/D conversion. On the other hand, when the signal REPMODE is "0", the direct selection mode is indicated.

Figure 22:
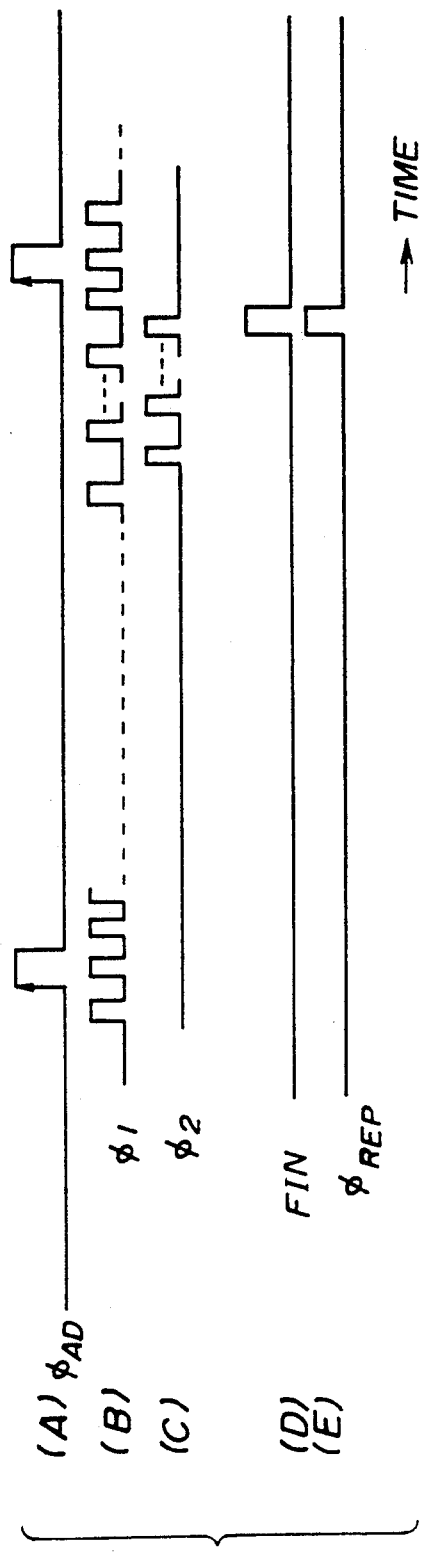
FIG.22 is a timing chart for explaining the operation of the sixth embodiment.

The clock $\phi_{REP}$ is generated only during the shift register mode. FIG.22 shows essential signals which are used in this embodiment. FIG.22(A) shows the start clock $\phi_{AD}$, FIG.22(B) shows the clock $\phi_1$, FIG.22(C) shows the clock $\phi_2$, FIG.22(D) shows the signal FIN, and FIG.22(E) shows the clock $\phi_{REP}$.

Further, the present invention is not limited to these embodiments, but various variations and modifications may be made without departing from the scope of the present invention.

What is claimed is:

1. An analog-to-digital converter comprising:
   sample and hold means for sampling and holding an analog input signal;
   comparator means for comparing the analog input signal held by said sample and hold means and an input signal and for generating an output signal;
   control means for generating a digital signal based on the output signal of said comparator means;
   digital-to-analog converter means for converting the digital signal generated from said control means into an analog signal and for supplying the analog signal to said comparator means as said input signal; and
   initial setting means for initializing the analog input signal held by said sample and hold means and the input signal which is output from said digital-to-analog converter means to a reference voltage, said initial setting means including a presettable storage means for storing initializing data and outputting the initializing data which has been stored;
   a switching means coupled to said initial setting means, said control means, and said digital-to-analog converter means, said switching means supplying the initializing data to said digital-to-analog converter means before start of the analog-to-digital conversion; and
   the held voltage of said sample and hold means is initialized by the voltage output from said digital-to-analog converter means in response to the initializing data.

2. The analog-to-digital converter as claimed in claim 1, wherein said sample and hold means includes sampling means for sampling the analog input signal at predetermined timings and holding means coupled to said sampling means for holding each sampled signal voltage, said sampling means and said holding means carrying out the sampling and holding during a sampling time.

3. The analog-to-digital converter as claimed in claim 2, which further comprises input means for receiving the analog input signal, said sampling and hold means being electrically coupled to said input means via said sampling means and electrically disconnected from said comparator means during the sampling time.

4. The analog-to-digital converter as claimed in claim 1, wherein said initial setting means is coupled to said sample and hold means and forcibly sets the reference voltage to be held by said sample and hold means during an initializing time.

5. The analog-to-digital converter as claimed in claim 4, which further comprises input means for receiving the analog input signal, said holding means being electrically disconnected from said input means and said comparator means during the initializing time.

6. The analog-to-digital converter as claimed in claim 1, wherein said sample and hold means carries out the sampling and holding during a sampling time, and said comparator means is coupled to said sample and hold means and compares a signal voltage of the analog input signal held by said sample and hold means with a signal voltage of the input signal and generates the output signal which indicates an error between the two compared voltages during a sequential comparison time which follows the sampling time.

7. The analog-to-digital converter as claimed in claim 6, which further comprises input means for receiving the analog input signal, said holding means being electrically disconnected from said input means and electrically coupled to said comparator means during the sequential comparison time.

8. The analog-to-digital converter as claimed in claim 1, wherein said control means is coupled to said comparator means and varies the digital signal based on the output signal of said comparator means, so that an error between the analog input signal and the analog signal output from said digital-to-analog converter means becomes approximately zero.

9. The analog-to-digital converter as claimed in claim 1, wherein said reference voltage is selected within a voltage range of the analog input signal.

10. The analog-to-digital converter as claimed in claim 9, wherein said reference voltage is selected to approximately ½ the voltage range.

11. The analog-to-digital converter as claimed in claim 1, wherein said sample and hold means carries out the sampling and holding during a sampling time and said initial setting means initializes the analog input signal and the input signal during an initializing time which occurs before the sampling time.

12. The analog-to-digital converter as claimed in claim 1, wherein said control means includes a control circuit for generating the digital signal based on the output signal of said comparator means and a first register for temporarily storing the digital signal output from said control circuit, and said digital-to-analog converter means converts the digital signal from said first register into the analog signal.

13. The analog-to-digital converter as claimed in claim 12, which further comprises input means for receiving the analog input signal, and said control means is electrically isolated from said input means, said comparator means and said digital-to-analog converter means in a state where the analog input signal received by said input means after one analog-to-digital conversion is held in said sample and hold means.

14. The analog-to-digital converter as claimed in claim 12, which further comprises a second register for storing the digital signal stored in said first register after one analog-to-digital conversion.

15. The analog-to-digital converter as claimed in claim 14, wherein said initial setting means sets the reference voltage based on the digital signal stored in said second register.

16. The analog-to-digital converter as claimed in claim 12, which further comprises switching means provided between said first register and said digital-to-analog converter means, said switching means coupling said initial setting means to said sample and hold means via said digital-to-analog converter means.

17. The analog-to-digital converter as claimed in claim 16, wherein said switching means selectively supplies the digital signal from said first register to said digital-to-analog converter means during a sequential comparison time in which said comparator means makes the comparison and selectively supplies the reference voltage from said initial setting means to said digital-to-analog converter means during an initializing time in which said initial setting means makes the initializing.

18. The analog-to-digital converter as claimed in claim 1, wherein said initial setting means sets the reference voltage in response to initializing data which is received from a central processing unit.

19. The analog-to-digital converter as claimed in claim 18, wherein the central processing unit is provided on a single integrated circuit chip on which the analog-to-digital converter is provided.

20. The analog-to-digital converter as claimed in claim 18, wherein a memory device is further provided on the single integrated circuit chip, and said initial setting means sets the reference voltage in response to initializing data which is read out from the memory device under a control of the central processing unit.

21. The analog-to-digital converter as claimed in claim 20, wherein the initializing data has a fixed value.

22. The analog-to-digital converter as claimed in claim 20, said control means includes a control circuit for generating the digital signal based on the output signal of said comparator means, a first register for temporarily storing the digital signal output from said control circuit, and a second register for storing the digital signal stored in said first register after one analog-to-digital conversion, and the initializing data stored in the memory device is renewed with every analog-to-digital conversion based on the digital signal stored in said second register.

23. The analog-to-digital converter as claimed in claim 22, wherein the central processing unit automatically supplies the initializing data read out from the memory device during at least an initializing time in which said initial setting means makes the initializing.

24. The analog-to-digital converter as claimed in claim 20, wherein the central processing unit reads out the initializing data from the memory device immediately after a power source of the single integrated circuit chip turns ON.

25. The analog-to-digital converter as claimed in claim 1, wherein:
said sample and hold means comprises sampling means including a plurality of switching elements for supplying the analog input signal on a plurality of lines, and holding means including a plurality of capacitors having first ends connected to corresponding ones of the lines, said capacitors having second ends coupled in common to said comparator means, and said control means includes a control circuit for generating the digital signal based on the output signal of said comparator means, and a register for temporarily storing the digital signal output from said control circuit, said digital-to-analog converter means converts the digital signal from said register into the analog signal, said digital-to-analog converter means being coupled to the lines, said capacitors having mutually different capacitances and being used in common as a part of said holding means and as a part of said digital-to-analog converter means.

26. The analog-to-digital converter as claimed in claim 25, wherein a total number of said capacitors is $n+1$, and said n capacitors respectively have capacitances such that second through nth capacitors respectively have capacitances $2^1, 2^1, 2^2, \ldots, 2^{n-1}$ times a capacitance of a first capacitor.

27. The analog-to-digital converter as claimed in claim 26, wherein said initial setting means temporarily stores a charge corresponding to the reference voltage to only one of said capacitors having a largest capacitance during an initializing time in which said initial setting means makes the initializing.

28. The analog-to-digital converter as claimed in claim 25, which further comprises input means for receiving the analog input signal, the first ends of said capacitors are electrically coupled to said input means via said sampling means and electrically disconnected from said digital-to-analog converter means during a sampling time in which said sample and hold means makes the sampling and holding, the first ends of said capacitors are electrically coupled to said digital-to-analog converter means and electrically disconnected from said input means during a sequential comparison time in which said comparator means makes the comparison, and the first ends of said capacitors are electrically disconnected from said input means and said digital-to-analog converter means during an initializing time in which said initial setting means makes the initializing.

29. The analog-to-digital converter as claimed in claim 1, wherein the analog input signal is received via a noise elimination filter including resistive and capacitive elements.

30. The analog-to-digital converter as claimed in claim 1, which further comprises input means for receiving the analog input signal, said input means includes a multiplexer for selecting one of a plurality of channels in response to a channel selection signal to supply the analog input signal which is received at the selected channel, and said initial setting means includes means for setting the reference voltage depending on the selected channel.

31. An analog-to-digital converter comprising:
input means for receiving an analog input signal;
sample and hold means, coupled to said input means, including sampling means for sampling the analog input signal from said input means at predetermined timings and holding means coupled to said sampling means for holding each sampled signal voltage, said sampling means and said holding means carrying out the sampling and holding during a sampling time;
comparator means, coupled to said sample and hold means, for comparing the signal voltage held by said sample and hold means with an analog control voltage and for outputting an output signal indicating an error between the two compared voltages during a sequential comparison time which follows the sampling time;

control means, coupled to said comparator means, for sequentially varying the analog control voltage based on the output signal of said comparator means until the error becomes approximately zero; and initial setting means, inserted between said input means and said sample and hold means, for forcibly setting a reference voltage to be held by said sample and hold means during an initializing time;

said holding means being electrically coupled to said input means via said initial setting means and electronically disconnected from said comparator means during the sampling time;

said holding means being electrically disconnected from said input means and electrically coupled to said comparator means during the sequential comparison time;

said holding means being electrically disconnected from said comparator means during the initializing time, said initial setting means including a presettable storage means for storing initializing data and outputting the initializing data which has been stored;

a switching means coupled to said initial setting means, said control means, and said digital-to-analog converter means, said switching means supplying the initializing data to said digital-to-analog converter means before start of the analog-to-digital conversion; and the held voltage of said sample and hold means is initialized by the voltage output from said digital-to-analog converter means in response to the initializing data.

32. The analog-to-digital converter as claimed in claim 31, wherein said initial setting means includes a differential amplifier having first and second input terminals and a gain of approximately one, said first input terminal receiving the analog input signal from said input means, first switching means for supplying the analog input signal from said input means to said sample and hold means during the sampling and sequential comparison times, and second switching means for feeding back an output of said differential amplifier to the second input terminal during the initializing time, said first and second switching means having outputs coupled in common to said sample and hold means.

33. An analog-to-digital converter comprising:
input means for receiving an analog input signal;
sample and hold means, coupled to said input means, including sampling means for sampling the analog input signal from said input means at predetermined timings and holding means coupled to said sampling means for holding each sampled signal voltage, said sampling means and said holding means carrying out the sampling and holding during a sampling time;
comparator means, coupled to said sample and hold means, for comparing the signal voltage held by said sample and hold means with an analog control voltage and for outputting an output signal indicating an error between the two compared voltages during a sequential comparison time which follows the sampling time;

control means, coupled to said comparator means, for sequentially varying the analog control voltage based on the output signal of said comparator means until the error becomes approximately zero; and initial setting means, coupled to said sample and hold means, for forcibly setting a reference voltage to be held by said sample and hold means during an initializing time;

said holding means being electrically coupled to said input means via said sampling means and electrically disconnected from said comparator means during the sampling time;

said holding means being electrically disconnected from said input means and electrically coupled to said comparator means during the sequential comparison time;

said holding means being electrically disconnected from said input means and said comparator means during the initializing time, said initial setting means including a presettable storage means for storing initializing data and outputting the initializing data which has been stored;

a switching means coupled to said initial setting means, said control means, and said digital-to-analog converter means, said switching means supplying the initializing data to said digital-to-analog converter means before start of the analog-to-digital conversion; and the held voltage of said sample and hold means is initialized by the voltage output from said digital-to-analog converter means in response to the initializing data.

* * * * *